(12) United States Patent
Okabe et al.

(10) Patent No.: US 12,167,633 B2
(45) Date of Patent: Dec. 10, 2024

(54) DISPLAY DEVICE WITH A COMMON FUNCTION LAYER SEPARATED INTO A DISPLAY SIDE AND A THROUGH-HOLE SIDE

(71) Applicant: SHARP KABUSHIKI KAISHA, Sakai (JP)

(72) Inventors: Tohru Okabe, Sakai (JP); Ryosuke Gunji, Sakai (JP); Shinsuke Saida, Sakai (JP); Shinji Ichikawa, Sakai (JP); Hiroharu Jinmura, Yonago (JP); Yoshihiro Nakada, Yonago (JP); Akira Inoue, Yonago (JP); Takeshi Yaneda, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 611 days.

(21) Appl. No.: 17/435,277

(22) PCT Filed: Mar. 1, 2019

(86) PCT No.: PCT/JP2019/008165
§ 371 (c)(1),
(2) Date: Aug. 31, 2021

(87) PCT Pub. No.: WO2020/178910
PCT Pub. Date: Sep. 10, 2020

(65) Prior Publication Data
US 2022/0149121 A1 May 12, 2022

(51) Int. Cl.
*H10K 59/00* (2023.01)
*H10K 59/124* (2023.01)
*H10K 59/131* (2023.01)

(52) U.S. Cl.
CPC .......... *H10K 59/00* (2023.02); *H10K 59/124* (2023.02); *H10K 59/131* (2023.02)

(58) Field of Classification Search
CPC ..... H10K 59/00; H10K 59/131; H10K 59/124
See application file for complete search history.

(56) References Cited

U.S. PATENT DOCUMENTS

| | | |
|---|---|---|
| 2007/0188093 A1 | 8/2007 | Nagara et al. |
| 2017/0110532 A1 | 4/2017 | Kim et al. |
| 2017/0148856 A1* | 5/2017 | Choi ................ H10K 59/124 |
| 2017/0237038 A1 | 8/2017 | Kim et al. |
| 2017/0288004 A1 | 10/2017 | Kim et al. |
| 2018/0233694 A1* | 8/2018 | Ajiki ................ H10K 59/122 |

FOREIGN PATENT DOCUMENTS

JP 2007-250520 A 9/2007

* cited by examiner

*Primary Examiner* — Lex H Malsawma
(74) *Attorney, Agent, or Firm* — ScienBiziP, P.C.

(57) ABSTRACT

A separation wall is provided in a frame-like shape along a peripheral edge of a through-hole in a non-display region which is defined to be in an island shape inside a display region and in which the through-hole is formed, the separation wall includes an inner metal layer provided in a frame-like shape on a first inorganic insulating film on a side of the through-hole, and a resin layer provided in a frame-like shape on the first inorganic insulating film and the inner metal layer, and the resin layer includes an inner protrusion portion provided in an eaves shape and protruding from the inner metal layer.

20 Claims, 29 Drawing Sheets

DISPLAY DEVICE WITH A COMMON FUNCTION LAYER SEPARATED INTO A DISPLAY SIDE AND A THROUGH-HOLE SIDE

TECHNICAL FIELD

The disclosure relates to a display device.

BACKGROUND ART

In recent years, a self-luminous type organic electroluminescence (hereinafter also referred to as EL) display device using an organic EL element has attracted attention as a display device that can replace liquid crystal display devices. Here, for example, the organic EL element includes an organic EL layer including a tight-emitting layer, a first electrode disposed on one surface side of the organic EL layer, and a second electrode disposed on the other surface side of the organic EL layer.

For example, PTL 1 discloses an organic electroluminescence display panel in which an organic EL layer and a second electrode formed using a vapor deposition method are divided by a partition wall having a reverse tapered portion.

CITATION LIST

Patent Literature

PTL 1: JP 2007-250520 A

SUMMARY

Technical Problem

In an organic EL display device, for example, to dispose a camera, a fingerprint sensor, and the like inside a display region for which an image is displayed, it is necessary to provide an island-shaped non-display region and provide through-holes extending through in a thickness direction in the non-display region. However, a common function layer formed using a vapor deposition method is disposed in the display region, and thus, when the through-holes described above are provided inside the display region, there is concern that moisture and the like may flow into the display region through the common function layer exposed from the through-holes. In such a case, an organic EL layer constituting the organic EL element deteriorates, and thus it is necessary to form the common function layer separated into a display region side and a through-hole side on the periphery of the through-holes. It is technically difficult to manufacture a vapor deposition mask such that a common function layer is not formed in the through-holes inside the display region and on the periphery thereof. Here, while it is effective to use a reverse tapered structure described in PTL 1 to form the common function layer separated into the display region side and the through-hole side, a negative photosensitive material is necessary for the reverse tapered structure, and the manufacturing cost becomes high, which leaves room for improvement.

The disclosure has been made in view of such points, and an object thereof is to form a common function layer separated into a display region side and a through-hole side at low cost.

Solution to Problem

To achieve the object described above, the display device according to the disclosure includes: a base substrate in which a display region where an image is displayed is defined, a frame region is defined on the periphery of the display region, and a non-display region having an island shape is defined inside the display region; a thin film transistor layer provided on the base substrate and including a first inorganic insulating film of at least one layer; a light-emitting element layer in which a plurality of light-emitting elements are arranged, the light-emitting element layer being provided on the thin film transistor layer; and a sealing film provided on the light-emitting element layer and including a second inorganic insulating film and a third inorganic insulating film, a first electrode, a function layer, and a second electrode being layered in this order in each of the plurality of light-emitting elements, a through-hole extending through in a thickness direction of the base substrate being formed in the non-display region. A separation wall is provided in a frame-like shape along a peripheral edge of the through-hole in the non-display region, the separation wall includes an inner metal layer provided in a frame-like shape on the first inorganic insulating film on a side of the through-hole and a resin layer provided in a frame shape on the first inorganic insulating film and the inner metal layer, the resin layer includes an inner protrusion portion provided in an eaves shape and protruding from the inner metal layer, a plurality of subpixels are arranged in correspondence with the plurality of light-emitting elements in the display region, the function layer includes a common function layer provided in common with the plurality of subpixels, the common function layer is provided on the separation wall while extending over from the display region to the through-hole and is cut apart at the inner protrusion portion, the second inorganic insulating film and the third inorganic insulating film are provided covering the separation wall while extending over from the display region to the through-hole, and the second inorganic insulating film is provided on a side of the base substrate of the inner protrusion portion.

Advantageous Effects of Disclosure

According to the disclosure, a separation wall includes an inner metal layer provided in a frame-like shape on a first inorganic insulating film of a thin film transistor layer on a through-hole and a resin layer provided in a frame-like shape on the first inorganic insulating film and the inner metal layer, and the resin layer includes an inner protrusion portion provided in an eaves shape and protruding from the inner metal layer, and thus a common function layer separated into the display region side and the through-hole side can be formed at low cost.

DESCRIPTION OF EMBODIMENTS

Embodiments of the disclosure, will be described below in detail with reference to the drawings. Note that the disclosure is not limited to each embodiment to be described below.

First Embodiment

Figure 1:
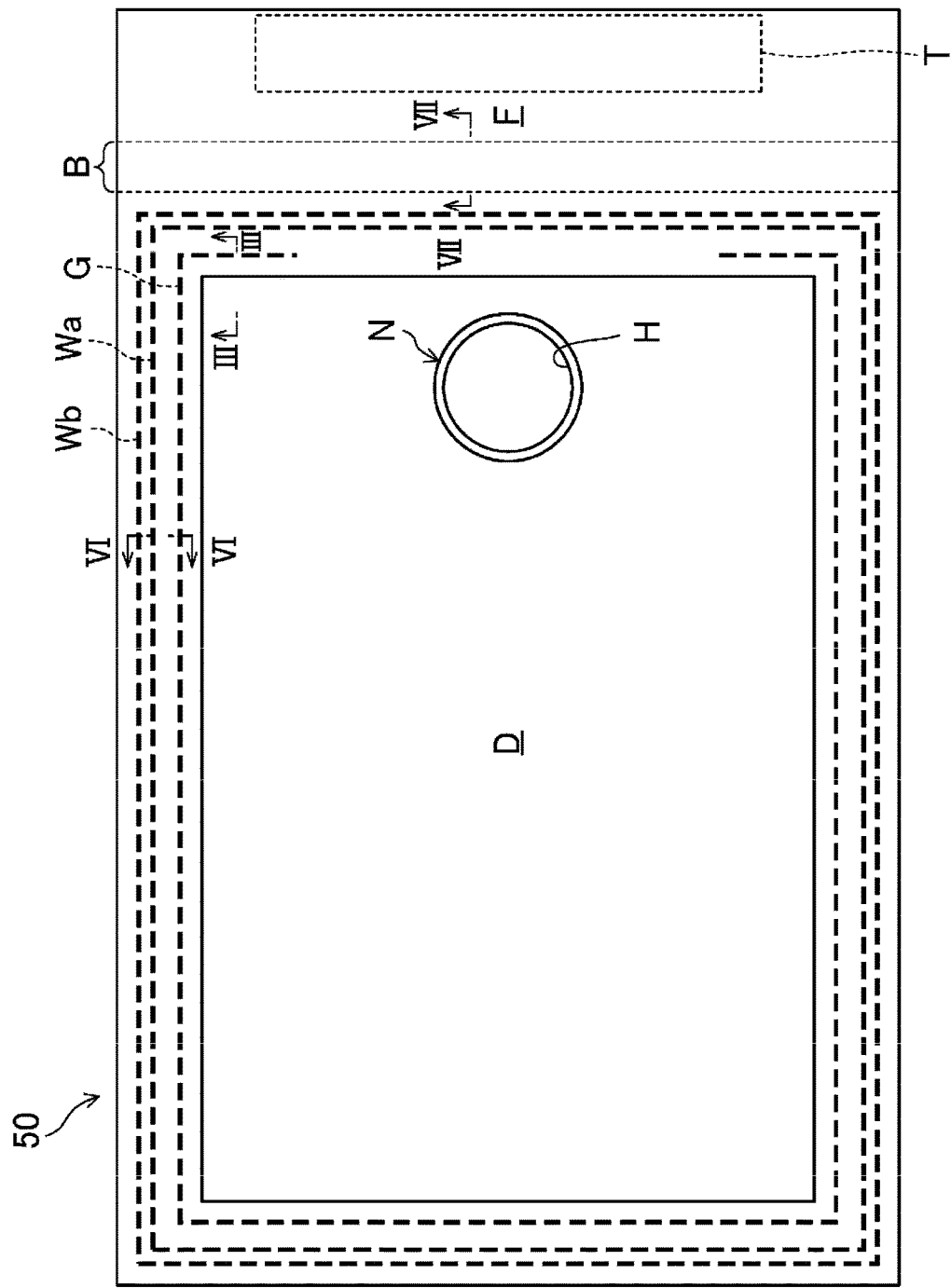
FIG. 1 is a plan view illustrating a schematic configuration of an organic EL display device according to a first embodiment of the disclosure.
Figure 2:
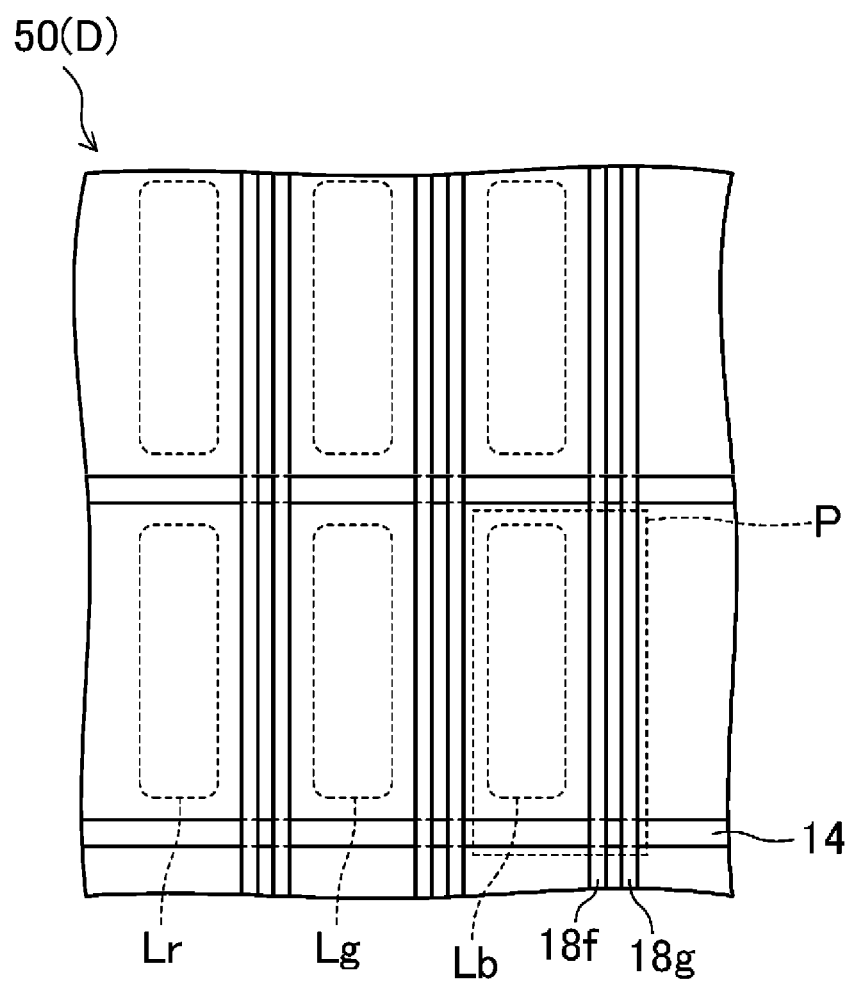
FIG. 2 is a plan view of a display region of the organic EL display device according to the first embodiment of the disclosure.
Figure 3:
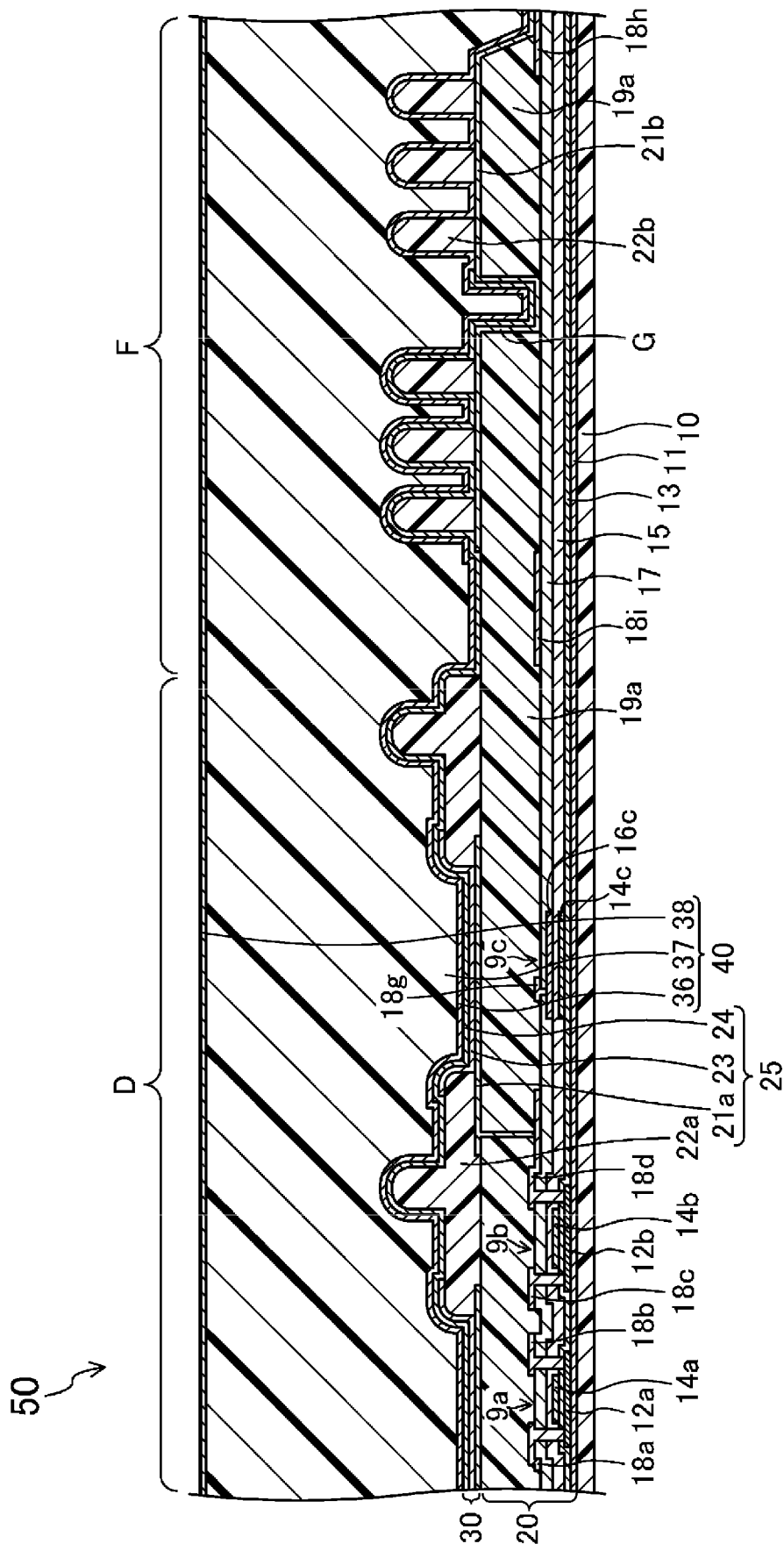
FIG. 3 is a cross-sectional view of the organic EL display device taken along a line III-III in FIG. 1.
Figure 4:
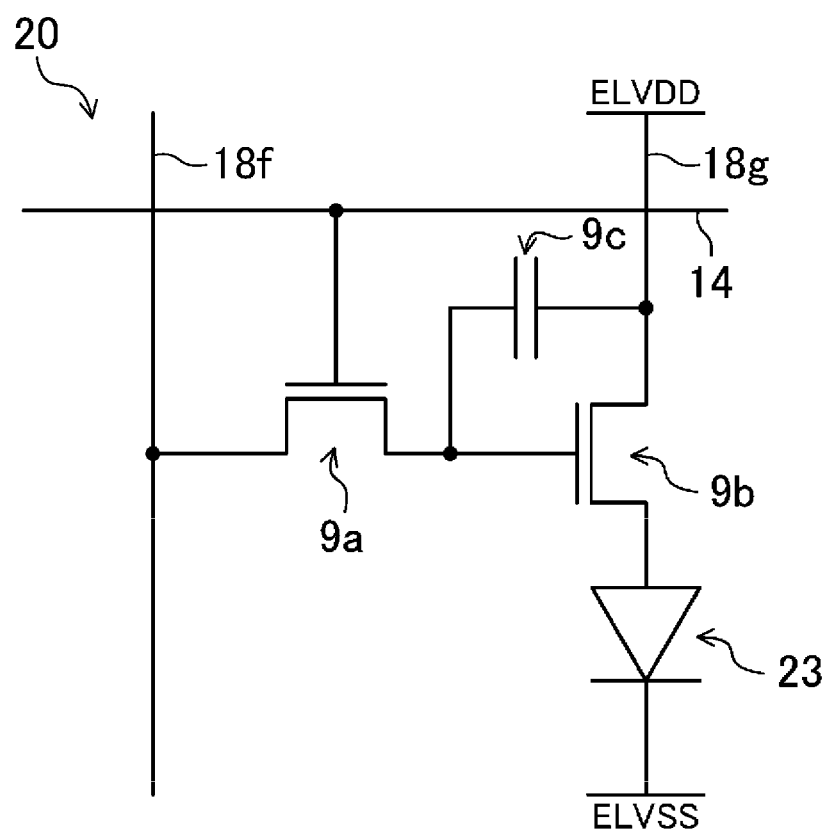
FIG. 4 is an equivalent circuit diagram of a TFT layer constituting the organic EL display device according to the first embodiment of the disclosure.
Figure 5:
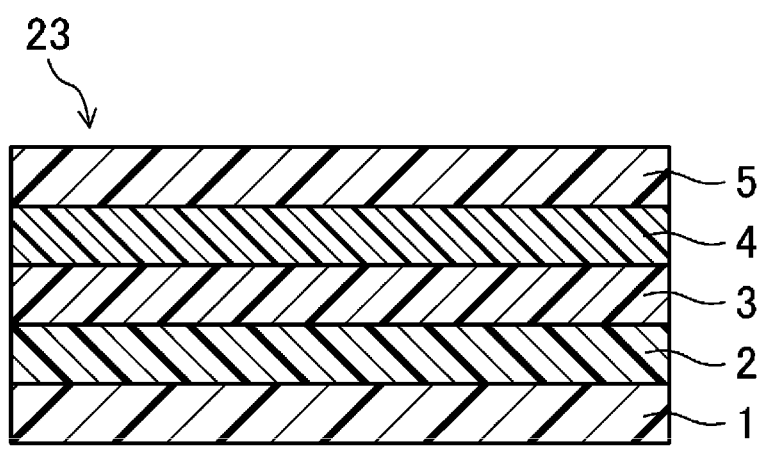
FIG. 5 is a cross-sectional view of an organic EL layer configuring the organic EL display device according to the first embodiment of the disclosure.
Figure 6:
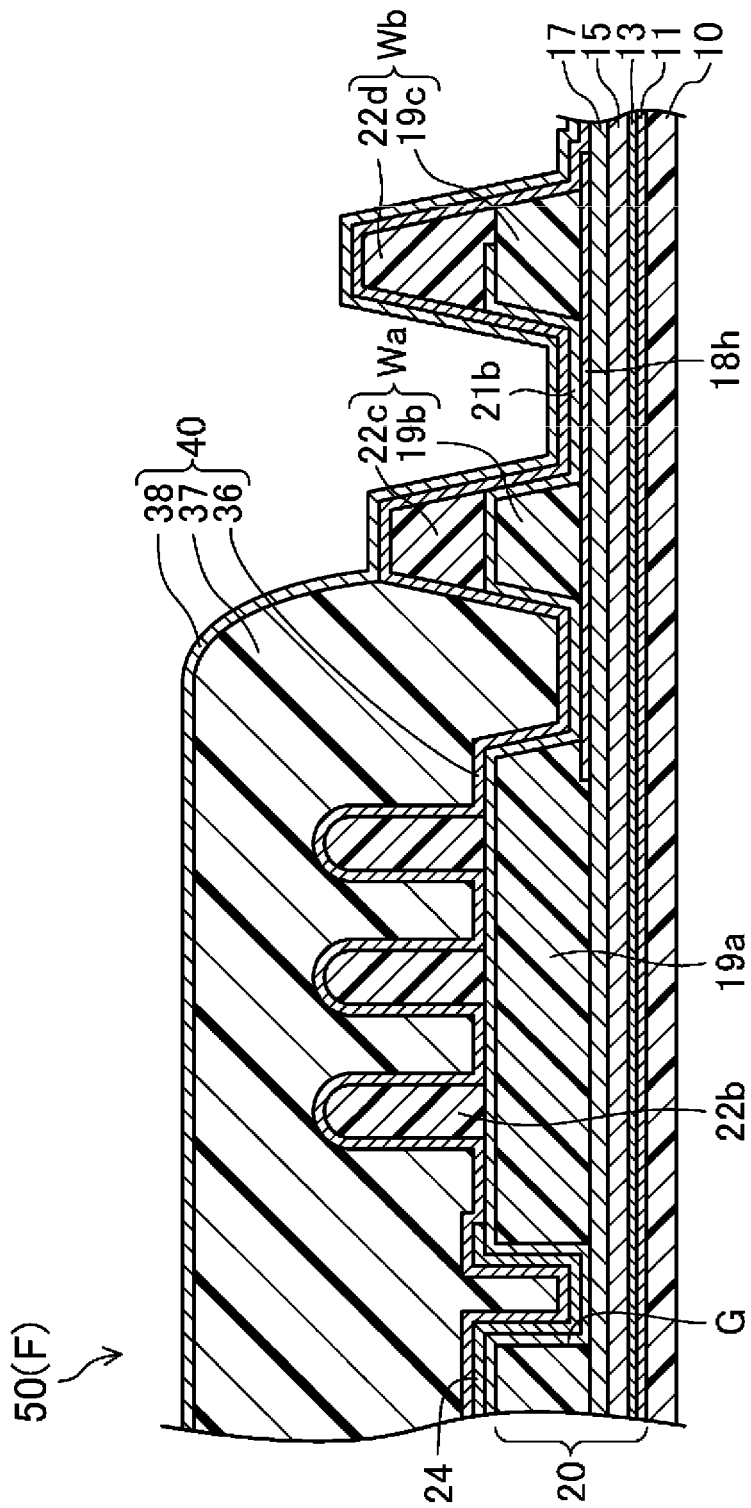
FIG. 6 is a cross-sectional view of a frame region of the organic EL display device taken along a line VI-VI in FIG. 1.
Figure 7:
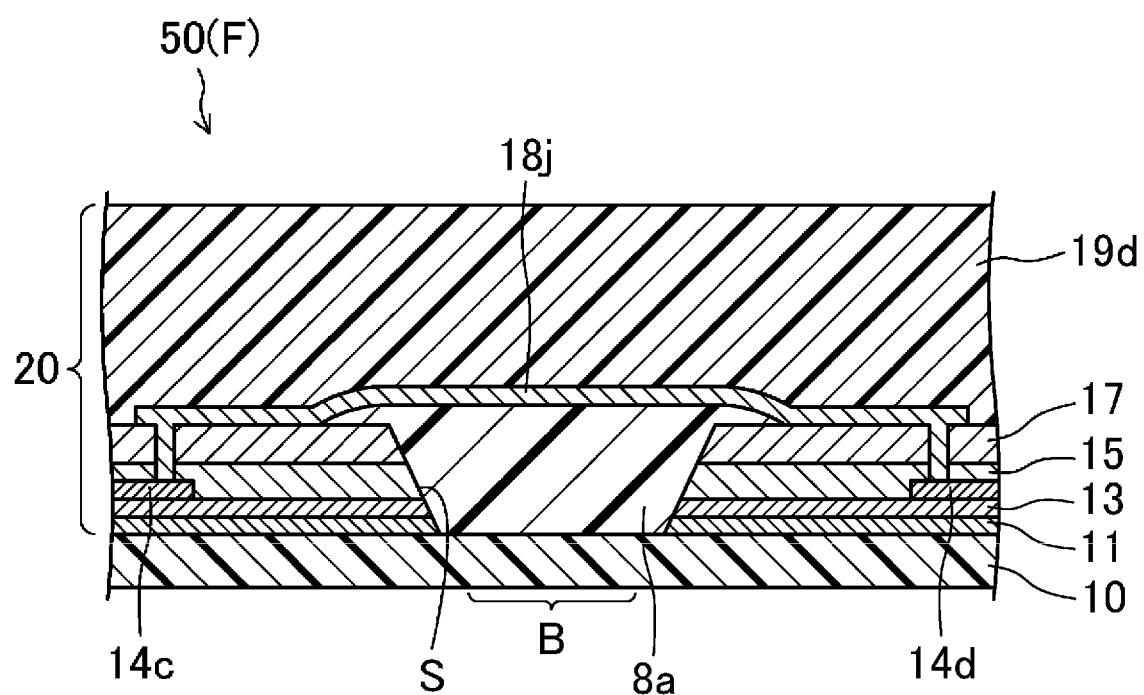
FIG. 7 is a cross-sectional view of a frame region of the organic EL display device taken along a line VII-VII in FIG. 1.
Figure 8:
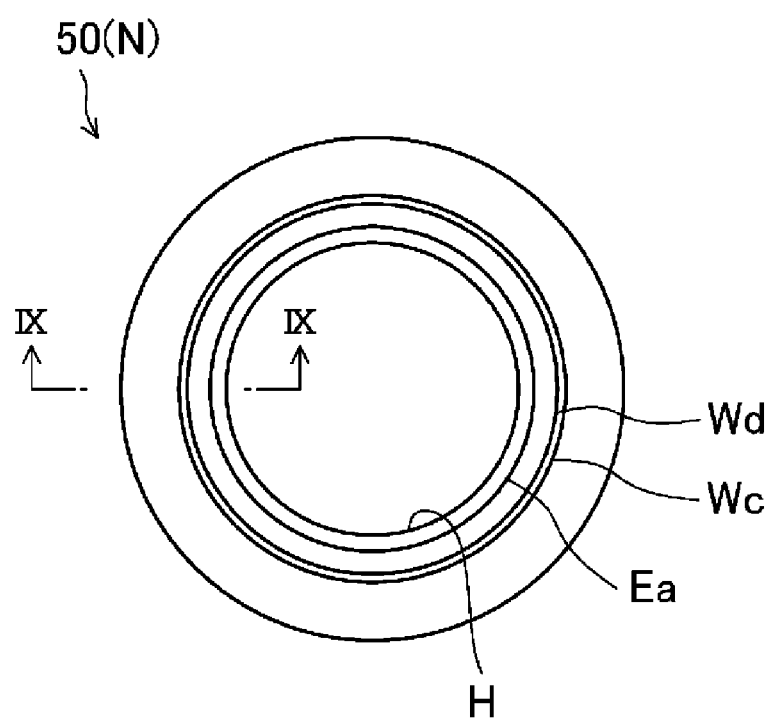
FIG. 8 is a plan view of a non-display region of the organic EL display device according to the first embodiment of the disclosure
Figure 9:
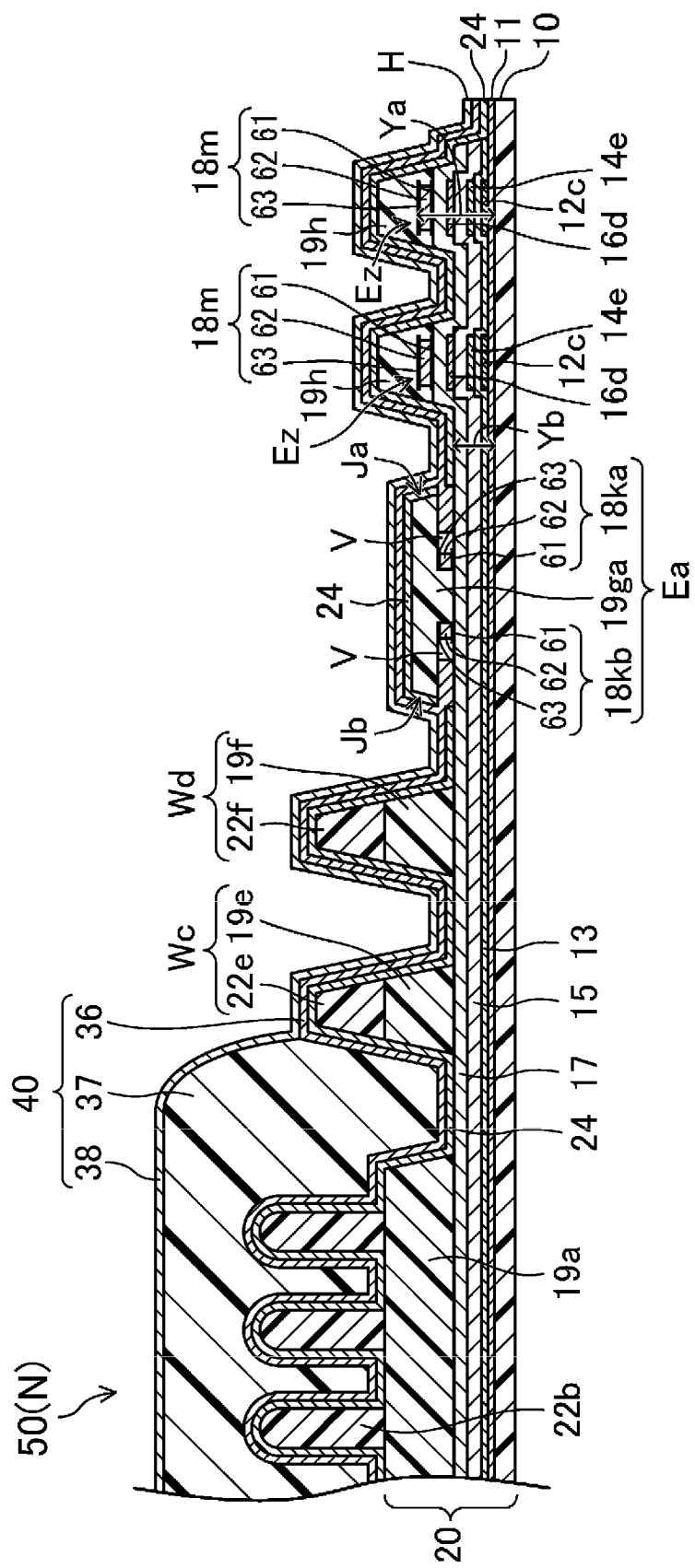
FIG. 9 is a cross-sectional view of the non-display region of the organic EL display device taken along a line IX-IX in FIG. 8.

FIGS. 1 to 28 illustrate a display device according to a first embodiment of the disclosure. Note that, in each of the following embodiments, an organic EL display device including an organic EL element will be exemplified as a display device including a light-emitting element. Here, FIG. 1 is a plan view illustrating a schematic configuration of an organic EL display device 50 according to the present embodiment. In addition, FIG. 2 is a plan view of a display region D of the organic EL display device 50. FIG. 3 is a cross-sectional view of the organic EL display device 50 taken along a line III-III in FIG. 1. FIG. 4 is an equivalent circuit diagram of a TFT layer 20 constituting the organic EL display device 50. FIG. 5 is a cross-sectional view of an organic EL layer 23 configuring the organic EL display device 50. FIGS. 6 and 7 are cross-sectional views of a frame region F of the organic EL display device 50 taken along a line VI-VI and a line VII-VII in FIG. 1. FIG. 8 is a plan view of a non-display region N of the organic EL display device 50. FIG. 9 is a cross-sectional view of the non-display region N of the organic EL display device 50 taken along a line IX-IX in FIG. 8.

As illustrated in FIG. 1, the organic EL display device 50 includes, for example, the display region D provided in a rectangular shape and configured to display an image and a frame region F provided in a rectangular frame-like shape on the periphery of the display region D. Note that in the present embodiment, the display region D having the rectangular shape has been exemplified, but examples of the rectangular shape include a substantially rectangular shape such as a shape whose sides are arc-shaped, a shape whose corners are arc-shaped, a shape in which a part of a side has a notch and the like.

As illustrated in FIG. 2, a plurality of subpixels P are arranged in a matrix shape in the display region D. In addition, in the display region D, for example, a subpixel P including a red light-emitting region Lr configured to display a red color, a subpixel P including a green light-emitting region Lg configured to display a green color, and a subpixel P including a blue light-emitting region Lb configured to display a blue color are provided adjacent to one another, as illustrated in FIG. 2. Note that one pixel is configured by, for example, three adjacent subpixels P including the red light-emitting region the green light-emitting region Lg, and the blue light-emitting region in the display region D. Further, as illustrated in FIG. 1, the non-display region N is provided in an island shape inside the display region D. Here, as illustrated in FIG. 1, in the non-display region N, a through-hole H that extends through a resin substrate layer 10 to be described below in a thickness direction is provided, for example, in order to allow a camera, a fingerprint sensor, and the like to be disposed. Note that a detailed structure and the like of the non-display region N will be described below with reference to FIGS. 8 and 9.

A terminal portion T is provided in an end portion of the frame region F on the right side in FIG. 1 in such a manner as to extend in one direction (a vertical direction in the drawing). In addition, in the frame region F, as illustrated in FIG. 1, a bending portion B that is bendable, for example, by 180 degrees (in a U-shape) with a vertical direction in the drawing as a bending axis is provided closer to the display region D than the terminal portion T and extends in one direction (the vertical direction in the drawing). Here, in the frame region F, in a flattening film 19a to be described below, as illustrated in FIGS. 1, 3, and 6, a trench G having a substantially C shape is provided such that it extends through the flattening film 19a. Note that, as illustrated in FIG. 1, the trench G is provided in a substantially C shape such that a terminal portion T side opens in a plan view.

As illustrated in FIGS. 3, 6, 7, and 9, the organic EL display device 50 includes a resin substrate layer 10 provided as a base substrate, a thin film transistor (hereinafter, also referred to as a TFT) layer 20 provided on the resin substrate layer 10, an organic EL element layer 30 provided as a light-emitting element layer on the TFT layer 20, and a sealing film 40 provided on the organic EL element layer 30.

The resin substrate layer 10 is formed, for example, of a polyimide resin or the like.

As illustrated in FIG. 3, the TFT layer 20 includes a base coat film 11 provided on the resin substrate layer 10 as a first inorganic insulating film, a plurality of first TFTs 9a, a plurality of second TFTs 9b, and a plurality of capacitors 9c provided on the base coat film 11, and the flattening film 19a provided on each of the first TFTs 9a, each of the second TFTs 9b, and each of the capacitors 9c, Here, in the TFT layer 20, as illustrated in FIG. 2 and FIG. 4, a plurality of gate lines 14 are provided so as to extend parallel to each other in the lateral direction in the drawings. In the TFT layer 20, as illustrated in FIG. 2 and FIG. 4, a plurality of source lines 18f are provided as a second wiring line layer in such as manner as to extend parallel to each other in the vertical direction in the drawings. Further, in the TFT layer 20, as illustrated in FIG. 2 and FIG. 4, a plurality of power source lines 18g are provided as the second wiring line layer in such a manner as to extend parallel to each other in the vertical direction in the drawings. Then, as illustrated in FIG. 2, each of the power source lines 18g is provided to be adjacent to one of the source lines 18f. Further, in the TFT layer 20, as illustrated in FIG. 4, the first TFT 9a, the second TFT 9b, and the capacitor 9c are disposed for each of the subpixels P.

The base coat film 11 is formed of a single-layer film or a layered film of an inorganic insulating film made of, for example, silicon nitride, silicon oxide, silicon oxynitride, or the like.

The first TFT 9a is electrically connected to the corresponding gate line 14 and source line 18f in each of the subpixels P, as illustrated in FIG. 4, Additionally, as illustrated in FIG. 3, the first TFT 9a includes a semiconductor layer 12a, a gate insulating film 13, a gate electrode 14a, a first interlayer insulating film 15, a second interlayer insulating film 17, and a source electrode 18a and a drain electrode 18b, which are provided in this order on the base coat film 11. As illustrated in FIG. 3, the semiconductor layer 12a, for example, is provided in an island shape on the base coat film 11 using a low-temperature polysilicon film and includes a channel region, a source region, and a drain region. In addition, as illustrated in FIG. 3, the gate insulating film 13 is provided as a first inorganic insulating film such that it covers the semiconductor layer 12a. Additionally, as illustrated in FIG. 3, the gate electrode 14a is provided on the gate insulating film 13 such that it overlaps with the channel region of the semiconductor layer 12a. Additionally, as illustrated in FIG. 3, the first interlayer insulating film 15 and the second interlayer insulating film 17 are provided in this order as a first inorganic insulating film to cover the gate electrode 14a. Additionally, as illustrated in FIG. 3, the source electrode 18a and the drain electrode 18b are separated from each other on the second interlayer insulating film 17. Additionally, as illustrated in FIG. 3, the source electrode 18a and the drain electrode 18b are electrically connected to the source region and the drain region of the semiconductor layer 12a, respectively, via each contact hole formed in a layered film including the gate insulating film 13, the first interlayer insulating film 15, and the second interlayer insulating film 17. Note that the gate insulating film 13, the first interlayer insulating film 15, and the second interlayer insulating film 17 are each constituted of a single-layer film or a layered film of an inorganic insulating film such as silicon nitride, silicon oxide, or silicon oxynitride.

The second TFT 9b is electrically connected to the corresponding first TFT 9a and power source line 18g in each of the subpixels P, as illustrated in FIG. 4. As illustrated in FIG. 3, the second TFT 9b includes a semiconductor layer 12b, the gate insulating film 13, a gate electrode 14b, the first interlayer insulating film 15, the second interlayer insulating film 17, and a source electrode 18c and a drain electrode 18d, which are provided in this order on the base coat film 11. Here, as illustrated in FIG. 3, the semiconductor layer 12b is provided in an island shape on the base coat film 11, for example, using a low-temperature polysilicon film and includes a channel region, a source region, and a drain region. Additionally, as illustrated in FIG. 3, the gate insulating film 13 is provided covering the semiconductor layer 12b. Additionally, as illustrated in FIG. 3, the gate electrode 14b is provided on the gate insulating film 13, and overlaps with the channel region of the semiconductor layer 12b. Additionally, as illustrated in FIG. 3, the first interlayer insulating film 15 and the second interlayer insulating film 17 are provided in this order to cover the gate electrode 14b. Additionally, as illustrated in FIG. 3, the source electrode 18c and the drain electrode 18d are separated from each other on the second interlayer insulating film 17. Additionally, as illustrated in FIG. 3, the source electrode 18c and the drain electrode 18d are electrically connected to the source region and the drain region of the semiconductor layer 12b, respectively, via each contact hole formed in a layered film including the gate insulating film 13, the first interlayer insulating film 15, and the second interlayer insulating film 17.

Note that in the present embodiment, the first TFT 9a and the second TFT 9b are exemplified as being of a top-gate type, but the first TFT 9a and the second TFT 9b may be a bottom-gate type TFT.

The capacitor 9c is electrically connected to the corresponding first TFT 9a and power source line 18g in each of the subpixels P, as illustrated in FIG. 4. Here, as illustrated in FIG. 3, the capacitor 9c includes a lower conductive layer 14c formed of the same material as and in the same layer as the gate electrodes 14a and 14b, the first interlayer insulating film 15 provided covering the lower conductive layer 14c, and an upper conductive layer foe provided on the first interlayer insulating film 15 as a first wiring line layer such that it overlaps with the lower conductive layer 14c. Note that as illustrated in FIG. 3, the upper conductive layer 16c is electrically connected to the power source line 18g via a contact hole formed in the second interlayer insulating film 17.

The flattening film 19a is, for example, formed of a positive photosensitive resin such as a polyimide resin.

As illustrated in FIG. 3, the organic EL element layer 30 includes a plurality of organic EL elements 25 provided as a plurality of light-emitting elements to be arranged in a matrix on the flattening film 19a.

As illustrated in FIG. 3, the organic EL element 25 includes the first electrode 21a provided on the flattening film 19a, an organic EL layer 23 provided on the first electrode 21a as a function layer, and a second electrode 24 provided on the organic EL layer 23 to be common to the plurality of subpixels P.

As illustrated in FIG. 3, the first electrode 21a is electrically connected to the drain electrode 18d of the second TFT 9b of each subpixel P via a contact hole formed in the flattening film 19a. The first electrode 21a functions to inject holes (positive holes) into the organic EL layer 23. The first electrode 21a is preferably formed of a material having a large work function to improve the efficiency of hole injection into the organic EL layer 23. Examples of materials constituting the first electrode 21a include metallic materials such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), and tin (Sn). Examples of materials constituting the first electrode 21a also include an alloy such as astatine (At)/astatine oxide ($AtO_2$). Furthermore, examples of materials constituting the first electrode 21a include electrically conductive oxides such as tin oxide (SnO), zinc oxide (ZnO), indium tin oxide (ITO), and indium zinc oxide (IZO). The first electrode 21a may also be formed by layering a plurality of layers formed of any of the materials described above. Note that, examples of compound materials having a large work function include indium tin oxide (ITO) and indium zinc oxide (IZO). Furthermore, the peripheral end portion of the first electrode 21a is covered with an edge cover 22a provided in a lattice shape common to the plurality of subpixels p. Examples of a material constituting the edge cover 22a include a positive photosensitive resin such as a polyimide resin, acrylic, resin, polysiloxane resin, and novolak resin. Further, as illustrated in FIG. 3, part of a surface of the edge cover 22a projects upward in the drawing and is a pixel photo spacer provided in an island shape.

As illustrated in FIG. 5, each organic EL layer 23 includes a hole injection layer 1, a hole transport layer 2, a light-emitting layer 3, an electron transport layer 4, and an electron injection layer 5, which are provided in that order on a first electrode 21a.

The hole injection layer 1 is also referred to as an anode buffer layer, has a function of bringing energy levels of the first electrode 21a and the organic EL layer 23 close to each other to improve hole injection efficiency from the first electrode 21a into the organic EL layer 23, and is provided as a common function layer that is common to the plurality of subpixels P. Here, examples of materials constituting the hole injection layer 1 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, stilbene derivatives, and the like. The common function layer is a function layer that is formed using a common metal mask (CMM). This CMM is a mask in which one opening is provided in correspondence with one display device, and thus a pattern that shields an area corresponding to the through-hole H cannot be provided. For this reason, a common function layer is also deposited on the area corresponding to the through-hole H. In contrast to this, an individual function layer is a function layer that is formed using a fine metal mask (FMM). This FMM is a mask in which an opening is provided for each color (for example, a function layer that is common to red and green is also included). Furthermore, in addition to the hole injection layer described above, the function layer includes the hole transport layer 2, the light-emitting layer 3, the electron transport layer 4, the electron injection layer 5, a blocking layer, a cap layer, and the like.

The hole transport layer 2 has a function of improving the hole transport efficiency from the first electrode 21a to the organic EL layer 23 and is provided as a common function layer that is common to the plurality of subpixels P. Here, examples of materials constituting the hole transport layer 2 include porphyrin derivatives, aromatic tertiary amine compounds, styrylamine derivatives, polyvinylcarbazole, poly-p-phenylenevinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, zinc selenide, and the like.

The light-emitting layer 3 is a region where positive holes and electrons are injected from the first electrode 21a and the second electrode 24, respectively, and the holes and the electrons recombine, when a voltage is applied via the first electrode 21a and the second electrode 24. Here, the light-emitting layer 3 is formed of a material having high light-emitting efficiency. Moreover, examples of materials constituting the light-emitting layer 3 include metal oxynoid compounds (8-hydroxyquinoline metal complexes), naphthalene derivatives, anthracene derivatives, diphenylethylene derivatives, vinyl acetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, trisstyrylbenzene derivatives, perylene derivatives, perinone derivatives, aminopyrene derivatives, pyridine derivatives, rhodamine derivatives, aquiline derivatives, phenoxazone, quinacridone derivatives, rubrene, poly-p-phenylenevinylene, polysilane, and the like.

The electron transport layer 4 has a function of efficiently moving electrons to the light-emitting layer 3 and is provided as a common function layer that is common to the plurality of subpixels P. Here, examples of materials constituting the electron transport layer 4 include oxadiazole derivatives, triazole derivatives, benzoquinone derivatives, naphthoquinone derivatives, anthraquinone derivatives, tetracyanoanthraquinodimethane derivatives, diphenoquinone derivatives, fluorenone derivatives, silole derivatives, metal oxynoid compounds, and the like, as organic compounds.

The electron injection layer 5 has a function of bringing energy levels of the second electrode 24 and the organic EL layer 23 close to each other to improve the efficiency of electron injection into the organic EL layer 23 from the second electrode 24, and this function allows the drive voltage of the organic EL element 25 to be lowered. The electron injection layer 5 is also referred to as a cathode buffer layer, and is provided as a common function layer that is common to the plurality of subpixels P. Here, examples of materials constituting the electron injection layer 5 include inorganic alkaline compounds, such as lithium fluoride (LiF), magnesium fluoride ($MgF_2$), calcium fluoride ($CaF_2$), strontium fluoride ($SrF_2$), barium fluoride ($BaF_2$) and the like, aluminum oxide ($Al_2O_3$), strontium oxide (SrO), and the like.

The common function layer described above is an example, and any one of the layers may be the individual function layer described above. For example, in a case where a display device is configured by performing color conversion of ultraviolet light or blue light emitted from the light-emitting layer using a Quantum-dot light emitting diode (QLED) or the like, the light-emitting layer may be a common function layer.

As illustrated in FIG. 3, the second electrode 24 is provided covering each of the organic EL layers 23 and the edge cover 22a. In addition, the second electrode 24 has a function of injecting electrons into the organic EL layer 23. In addition, the second electrode 24 is preferably formed of a material with a low work function to improve the efficiency of electron injection into the organic EL layer 23. Here, examples of materials constituting the second electrode 24 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). The second electrode 24 may also be formed of alloys such as magnesium (Mg)/copper (Cu), magnesium (Mg) silver (Ag), sodium (Na)/potassium (K), astatine (At)/astatine oxide ($AtO_2$), lithium (Li)/aluminum (Al), lithium (Li)/calcium (Ca)/aluminum (Al), and lithium fluoride (Lin/calcium (Ca)/ aluminum (Al), for example. In addition, the second electrode 24 may be formed of an electrically conductive oxide such as tin oxide (SnO), zinc oxide (ZnO), indium tin oxide (ITO), indium zinc oxide (IZO), or the like. In addition, the second electrode 24 may be formed by layering a plurality of layers formed of any of the materials described above. Note that, examples of materials having a small work function include magnesium (Mg), lithium (Li), lithium fluoride (LiF), magnesium (Mg)/copper (Cu), magnesium (Mg)/silver (Ag), sodium (Na)/potassium (K), lithium (Li)/ aluminum (Al), lithium (Li)/calcium (Ca)/aluminum (Al), lithium fluoride (LiF)/calcium (Ca)/aluminum (Al), and the like.

As illustrated in FIGS. 3, 6, 7, and 9, the sealing film 40 includes a second inorganic insulating film 36 provided covering the second electrode 24, an organic insulating film 37 provided on the second inorganic insulating film 36, and a third inorganic insulating film 38 provided covering the organic insulating film 37 and has a function of protecting the organic EL layer 23 from moisture, oxygen, and the like. Here, the second inorganic insulating film 36 and the third inorganic insulating film 38, for example, are formed of an inorganic material such as silicon oxide ($SiO_2$), aluminum oxide ($Al_2O_3$), silicon nitride (SiNx (here, x is a positive number)) such as trisilicon tetranitride ($Si_3N_4$), or silicon carbonitride (SiCN). Further, the organic insulating film 37 is formed of, for example, an organic material such as an acrylic resin, polyurea resin, parylene resin, polyimide resin, and polyamide resin.

Additionally, as illustrated in FIG. 1, the organic EL display device 50 includes a first external dam wall Wa provided in a frame-like shape so as to surround the display region D and a second external dam wall Wb provided in a frame-like shape so as to surround the first external dam wall Wa in the frame region F.

As illustrated in FIG. 6, the first external dam wall Wa includes a first lower resin layer 19b formed of the same material as that of the flattening film 19a in the same layer and a first upper resin layer 22c that is provided above the first lower resin layer 19b with the first conductive layer 21b therebetween and is formed of the same material as that of the edge cover 22a in the same layer. As illustrated in FIG. 6, the first conductive layer 21b is provided in a substantially C shape in such a manner as to overlap with the trench G, the first external dam wall Wa, and the second external dam wall Wb in the frame region F. Note that the first conductive layer 21b is formed of the same material and in the same layer as the first electrode 21a.

As illustrated in FIG. 6, the second external dam wall Wb includes a second lower resin layer 19c formed of the same material as that of the flattening film 19a in the same layer and a second upper resin layer 22d that is provided above the second lower resin layer 19c with the first conductive layer 21b therebetween and is formed of the same material as that of the edge cover 22a in the same layer.

As illustrated in FIGS. 3 and 6, the organic EL display device 50 includes a first frame wiring line 18h provided in a substantially C shape on the outer side of the trench G in such a manner as to surround the display region D and overlap with the first external dam wall Wa and the second external dam wall Wb in the frame region F. Here, the first frame wiring line 18h is electrically connected to a power source terminal to which a low power supply voltage (ELVSS) is input in the terminal portion T. Further, as illustrated in FIG. 6, the first frame wiring line 18h is electrically connected to the second electrode 24 via the first conductive layer 21b.

As illustrated in FIG. 3, the organic EL display device 50 includes a second frame wiring line 18i provided in a substantially C shape on the inner side of the trench C in the frame region F. Here, the second frame wiring line 18i is electrically connected to a power source terminal to which a high power supply voltage (ELVDD) is input in the terminal portion T. The second frame wiring line 18i is electrically connected, on the display region D side, to the plurality of power source lines 18g disposed in the display region D.

As illustrated in FIG. 7, the organic EL display device 50 includes a lower layer flattening film 8a provided to fill in the slit S formed in the base coat film 11, the gate insulating film 13, the first interlayer insulating film 15, and the second interlayer insulating film 17, a plurality of lead wiring lines 18j provided on the lower layer flattening film 8a and the second interlayer insulating film 17, and a wiring line covering layer 19d provided covering the plurality of lead wiring lines 18j in the bending portion B.

As illustrated in FIG. 7, the slit S is provided to be formed in a groove shape passing along a direction in which the bending portion B extends to extend through the base coat film 11, the gate insulating film 13, the first interlayer insulating film 15 and the second interlayer insulating film 17 and expose the surface of the resin substrate layer 10.

The lower layer flattening film 8a is formed of, for example, an organic resin material such as a polyimide resin.

The plurality of lead wiring lines 18j are provided extending parallel to each other in a direction orthogonal to the direction in which the bending portion B extends. Here, as illustrated in FIG. 7, both end portions of each of the lead wiring lines 18j are electrically connected to the first gate conductive layer 14c and the second gate conductive layer 14d via each contact hole formed in a layered film of the first interlayer insulating film 15 and the second interlayer insulating film 17, Note that the lead wiring lines 18j are formed of the same material as that of the source line 18f and the power source line 18g in the same layer. Further, as illustrated in FIG. 7, the first gate conductive layer 14c is provided between the gate insulating film 13 and the first interlayer insulating film 15 and is electrically connected to signal wiring lines (the gate line 14, the source line 18f, and the like) extending toward the display region D. Further, as illustrated in FIG. 7, the second gate conductive layer 14d is provided between the gate insulating film 13 and the first interlayer insulating film 15 and, for example, is electrically connected to a signal terminal of the terminal portion T. The wiring line covering layer 19d is formed of the same material as that of the flattening film 19a in the same layer.

As illustrated in FIGS. 3, 6, and 9, the organic EL display device 50 includes a plurality of peripheral photo spacers 22b each provided in an island shape so as to protrude upward in the drawing on the flattening film 19a in the frame region F and the non-display region N. Each peripheral photo spacer 22b is formed of the same material and in the same layer as the edge cover 22a. The peripheral photo spacer 22b may be formed by layering a resin layer formed of the same material as that of the edge cover 22a in the same layer and another resin layer.

As illustrated in FIGS. 8 and 9, the organic EL display device 50 includes a separation wall Ea provided in a frame-like shape along a peripheral edge of the through-hole H in the non-display region N.

As illustrated in FIG. 9, the separation wall Ea includes an inner metal layer 18ka provided in a frame-like shape on the second interlayer insulating film 17 on a side of the through-hole 14, an outer metal layer 18kb provided in a frame-like shape on the second interlayer insulating film 17 on a side of the display region D, and a resin layer 19ga provided in a frame-like shape on the second interlayer insulating film 17, the inner metal layer 18ka, and the outer metal layer 18kb.

The inner metal layer 18ka and the outer metal layer 18kb are formed of the same material as those of the source line 18f and the power source line 18g in the same layer. Also, as illustrated in FIG. 9, each of the inner metal layer 18ka and the outer metal layer 18kb includes a first constituent metal layer 61, a second constituent metal layer 62, and a third constituent metal layer 63 provided in this order from the resin substrate layer 10 side. Here, as illustrated in FIG. 9, the first constituent metal layer 61 and the third constituent metal layer 63 are provided protruding from the second constituent metal layer 62. Also, as illustrated in FIG. 9, spaces V are provided between the inner metal layer 18ka and the outer metal layer 18kb and the second inorganic insulating film 36, respectively. As illustrated in FIG. 9, the spaces V are provided so as to be surrounded by the second inorganic insulating film 36, the resin layer 19ga, and the second interlayer insulating film 17 on the display region D side and the through-hole H side of the separation wall Ea, respectively.

The resin layer 19ga is formed of the same material as that of the flattening film 19a in the same layer. Additionally, as illustrated in FIG. 9, the resin layer 19ga includes an inner protrusion portion Ja provided in an eaves shape and protruding from the inner metal layer 18ka toward the through-hole H and an outer protrusion portion Jb provided in an eaves shape and protruding from the outer metal layer 18kb toward the display region D. Here, as illustrated in FIG. 9, the second electrode 24 is disposed on the separation wall Ea so as to extend over from the display region D to the through-hole H and is cut apart at the inner protrusion portion Ja and the outer protrusion portion Note that although the hole injection layer 1, the hole transport layer 2, the electron transport layer 4, and the electron injection layer 5 are not illustrated in FIG. 9, similar to the second electrode 24, the common function layer including the hole injection layer 1, the hole transport layer 2, the electron transport layer 4, and the electron injection layer 5 is provided on the separation wall Ea so as to extend over from the display region D to the through-hole H and is curt apart at the inner protrusion portion Ja and the outer protrusion portion Jb. Furthermore, as illustrated in FIG. 9, the second inorganic insulating film 36 and the third inorganic insulating film 38 constituting the sealing film 40 are disposed on the separation wall Ea so as to extend over from the display region D to the through-hole H, and the second inorganic insulating film 36 is provided on a side of the resin substrate layer 10 of the inner protrusion portion Ja and the outer protrusion portion Jb. Furthermore, as illustrated in FIG. 9, the second interlayer insulating film 17 and the second inorganic insulating film 36 are in contact with each other on a side of the resin substrate layer 10 of the inner protrusion portion Ja and the outer protrusion portion Jb.

As illustrated in FIGS. 8 and 9, the organic EL display device 50 includes a first internal dam wall Wc and a second internal dam wall Wd each provided in a frame-like shape along the periphery of the separation wall Ea on the display region D side of the separation wall Ea in the non-display region N.

As illustrated in FIG. 9, the first internal dam wall We includes a first lower resin layer 19e formed of the same material as that of the flattening film 19a in the same layer and a second upper resin layer 22e that is provided on the first lower resin layer 19e and is formed of the same material as that of the edge cover 22a in the same layer. Here, as illustrated in FIG. 9, the first internal dam wall Wc is provided overlapping with the peripheral end portion of the organic insulating film 37 on the display region D side of the non-display region N.

As illustrated in FIG. 9, the second internal dam wall Wd includes a second lower resin layer 19f formed of the same material as that of the flattening film 19a in the same layer and a second upper resin layer 22f that is provided on the second lower resin layer 19f and is formed of the same material as that of the edge cover 22a in the same layer. Here, as illustrated in FIG. 9, the second internal dam wall Wd is provided between the first internal dam wall Wc and the separation wall Ea in the non-display region N.

In addition, as illustrated in FIG. 9, the organic EL display device 50 includes one pair of layered thick film portions Ez provided in a frame-like shape along a peripheral edge of the through-hole H between the separation wall Ea and the through-hole H in the non-display region N.

As illustrated in FIG. 9, the layered thick film portion Ez includes a base coat film 11, a thick film semiconductor layer 12c, a gate insulating film 13, a thick film gate metal layer 14e, a first interlayer insulating film 15, a thick film middle metal layer 16d, a second interlayer insulating film 17, and a thick film source metal layer 18m that are provided in this order on the resin substrate layer 10 as a plurality of inorganic films. The acoustic compliance (volume/(density× sound speed$^2$)) of these plurality of inorganic films is of the same level. Here, as illustrated in FIG. 9, a total thickness Ya of the plurality of inorganic films (the base coat film 11 to the thick film source metal layer 18m) in the layered thick film portion Ez is greater than a total thickness Yb of the plurality of inorganic films (the base coat film 11 to the second interlayer insulating film 17) between the layered thick film portion Ez and the separation wall Ea. The thick film semiconductor layer 12c is formed of the same material as those of the semiconductor layers 12a and 12b (inorganic films) constituting the TFT layer 20 in the same layer. The thick film gate metal layer 14e is formed of the same material as that of the gate line 14 of the metal layer (inorganic film) constituting the TFT layer 20 in the same layer. The thick film middle metal layer 16d is formed of the same material as that of the upper conductive layer 16c of the metal layer (inorganic film) constituting the TFT layer 20 in the same layer. The thick film source metal layer 18m of the metal layer (inorganic film) constituting the layered thick film portion Ez is formed of the same material as those of the source line 18f and the power source line 18g in the same layer. According to such a configuration, by forming the layered thick film portion Ez that is thicker than the inorganic film disposed on the periphery thereof, propagation of cracks in the semiconductor layer and the inorganic insulating film can be inhibited. Note that as illustrated in FIG. 9, a thick film portion resin layer 19h formed of the same material as that of the flattening film 19a in the same layer is provided between the layered thick film portion Ez and the sealing film 40 (the second inorganic insulating film 36).

As illustrated in FIG. 9, the gate insulating film 13, the first interlayer insulating film 15, and the second interlayer insulating film 17 are provided so as not to reach the end surface of the through-hole H in the non-display region N. Here, to inhibit cracks that propagate in an inorganic film, the semiconductor layer and the inorganic insulating film in which cracks may easily occur may be formed thinner in the peripheral portion of the through-hole H.

The organic EL display device 50 described above is configured such that, in each subpixel P, when a gate signal is input to the first TFT 9a via the gate line 14 to cause the first TFT 9a to be in the on state, a data signal is written to the gate electrode 14b of the second TFT 9b and the capacitor 9c via the source line 18f, and a current from the power source line 18g corresponding to the gate voltage of the second TFT 9b is supplied to the organic EL layer 23, the light-emitting layer 3 of the organic EL layer 23 emits light to display an image. Note that, in the organic EL display device 50, because even when the first TFT 9a is turned off, the gate voltage of the second TFT 9b is held by the capacitor 9c, the light-emitting layer 3 is kept emitting light until a gate signal of the next frame is input.

Figure 10:
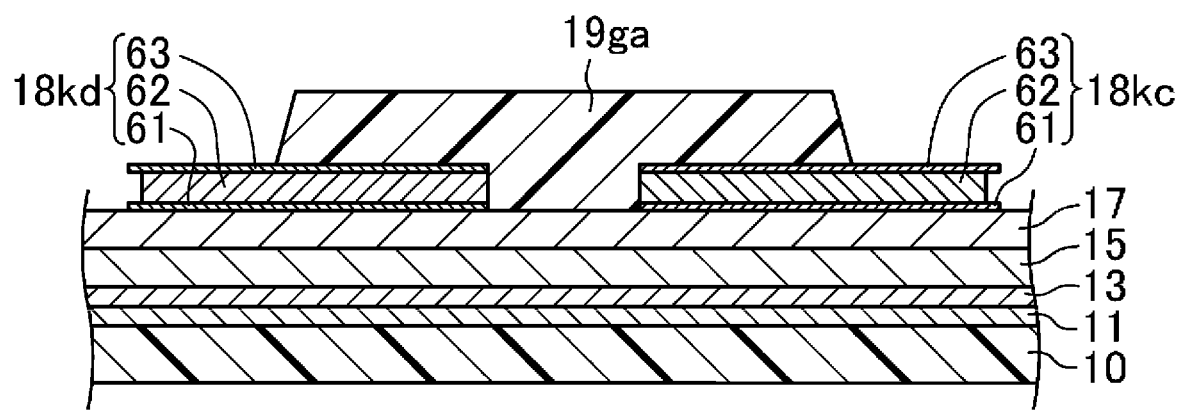
FIG. 10 is a cross-sectional view illustrating a flattening film forming step performed when a separation wall configuring the organic EL display device according to the first embodiment of the disclosure is formed.
Figure 11:
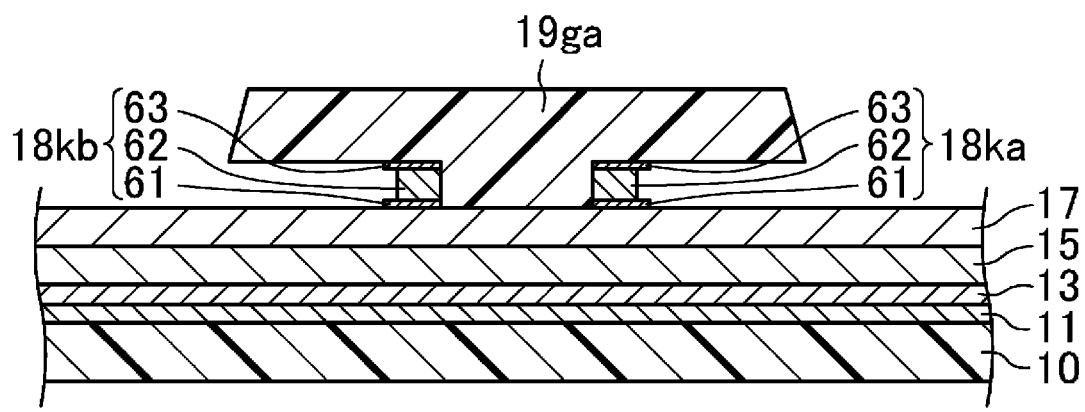
FIG. 11 is a cross-sectional view illustrating an etching step performed when a separation wall configuring the organic EL display device according to the first embodiment of the disclosure is formed.

Next, a method for manufacturing the organic EL display device 50 according to the present embodiment will be described. Here, the method for manufacturing the organic EL display device 50 according to the present embodiment includes a TFT layer forming step, an organic EL element layer forming step, a sealing film forming step, a flexibilization step, and a through-hole forming step. FIGS. 10 and 11 are cross-sectional views illustrating a flattening film forming step and an etching step at the time of forming the separation wall Ea.

TFT Layer Forming Step

For example, by using a known method, the TFT layer 20a is formed by forming the base coat film 11, the first TFT 9a, the second. TFT 9b, the capacitor 9c, and the flattening film 19a on a surface of the resin substrate layer 10, which is formed on a glass substrate.

Here, when forming the source electrode 18a and the drain electrode 18b of the first TFT 9a and the like, first, in the non-display region N, an inner metal forming layer 18kc (see FIG. 10) and an outer metal forming layer 18kd (see FIG. 10) in which a first constituent metal layer 61 (for example, composed of a titanium film with a thickness of approximately 30 nm or the like), a second constituent metal layer 62 (for example, composed of an aluminum film with a thickness of approximately 300 mn or the like), and the third constituent metal layer 63 (for example, composed of an titanium film with a thickness of approximately 50 nm or the like) are layered are formed. In the present embodiment, although a source metal layer having a three-layer structure of Ti (upper layer)/Al (middle layer)/Ti (lower layer) has been illustrated, the source metal layer may have a two-layer structure of Cu (upper layer)/Ti (lower layer) or the like. In the case of this two-layer structure of Cu (upper layer)/Ti (lower layer), a side face of Cu (the upper layer) is formed to be recessed from a side face of Ti (the lower layer).

Next, as illustrated in FIG. 10, when forming the flattening film 19a, a resin layer 19ga is formed in the non-display region N.

Furthermore, after a resist pattern (not illustrated) is formed to expose the resin layer 19ga, the inner metal forming layer 18kc and the outer metal forming layer 18kd are partially removed from the lateral side through wet etching, and, as illustrated in FIG. 11, an inner metal layer 18ka and an outer metal layer 18kb are formed.

Organic EL Element Layer Forming Step

The organic EL element 25 is formed by forming the first electrode 21a, the edge cover 22a, the organic EL layer 23 (the hole injection layer 1, the hole transport layer the tight-emitting layer 3, the electron transport layer 4, and the electron injection layer 5), and the second electrode 24 on the flattening film 19a of the TFT layer 20 formed in the TFT layer forming step described above by using a known method, whereby the organic EL element layer 30 is formed.

Here, when the organic EL layer 23 and the second electrode 24 are formed using a vapor deposition method, the hole injection layer 1, the hole transport layer 2, the electron transport layer 4, and the electron injection layer 5 that constitute the organic EL layer 23 and the second electrode 24 are formed while being cut apart due to difference in level.

Sealing Film Forming Step

First, for example, an inorganic insulating film such as a silicon nitride film, a silicon oxide film, or a silicon oxynitride film is formed using a mask by a plasma CND method on a substrate surface in which the organic EL element 25 has been formed in the organic EL element layer forming step, whereby a second inorganic insulating film 36 is formed.

Next, on the substrate surface where the second inorganic insulating film 36 is formed, a film of an organic resin material such as an acrylic resin is formed, for example, by using an inkjet method, whereby an organic insulating film 37 is formed.

Further, for example, an inorganic insulating film such as a silicon nitride film, a silicon oxide film, or a silicon oxynitride film is formed using a mask by a plasma CVD method on the substrate where the organic insulating film 37 is formed to form a third inorganic insulating film 38, whereby a sealing film 40 is formed.

Flexibilization Step

After a protective sheet (not illustrated) is bonded to the substrate surface on which the sealing film 40 is formed through the sealing film forming step, by emitting laser light from the glass substrate side of the resin substrate layer 10, the glass substrate is peeled off from a lower face of the resin substrate layer 10, and then, a protective sheet (not illustrated) is bonded to the lower surface of the resin substrate layer 10 from which the glass substrate has been peeled off.

Through-Hole Forming Step

For example, by emitting laser light to an inner peripheral side area of the inner layered thick film portion Ez provided in a frame-like shape (circumferential shape) on the resin substrate layer 10, from which the glass substrate has been peeled off in the flexibilization step, while scanning the inner peripheral side area with the laser light in a circular shape, a through-hole H is formed.

The organic EL display device 50 of the present embodiment can be manufactured in the manner described above.

Here, in the present embodiment, although an example of the organic EL display device 50 in which the separation wall Ea is provided in the non-display region N has been illustrated, an organic EL display device in which separation walls Eb to Eh are provided in place of the separation wall Ea may be used. Hereinafter, first to eighth modified examples using the separation walls Eb to Eh will be described. In the following modified examples, parts identical to those in FIGS. 1 to 14 are denoted by the same reference signs, and detailed descriptions thereof will be omitted.

First Modified Example

Figure 12:
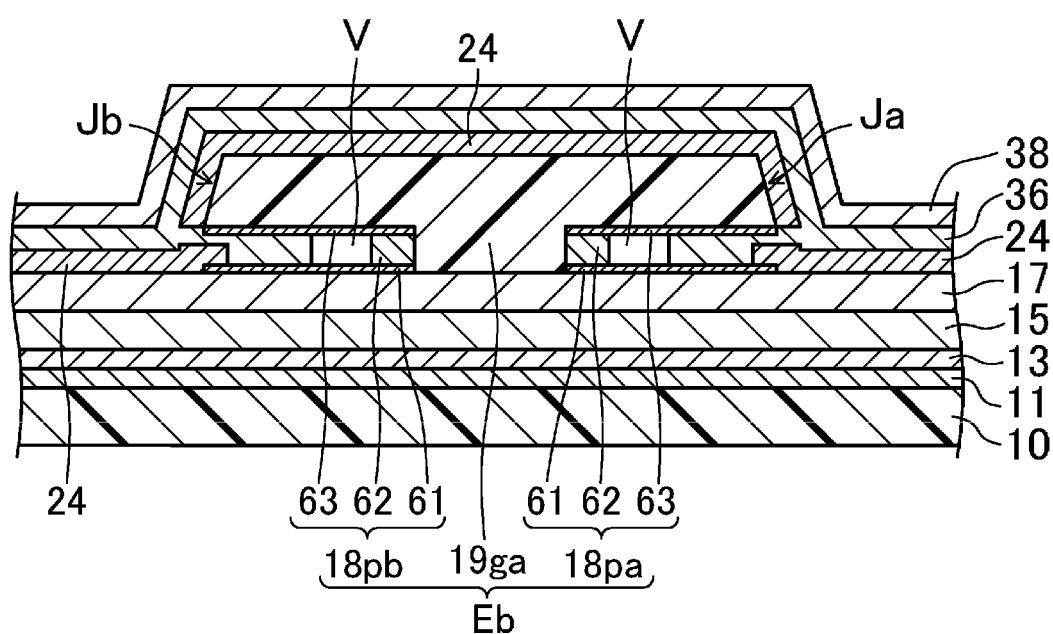
FIG. 12 is a cross-sectional view of a first modified example of a separation wall configuring the organic EL display device according to the first embodiment of the disclosure.
Figure 13:
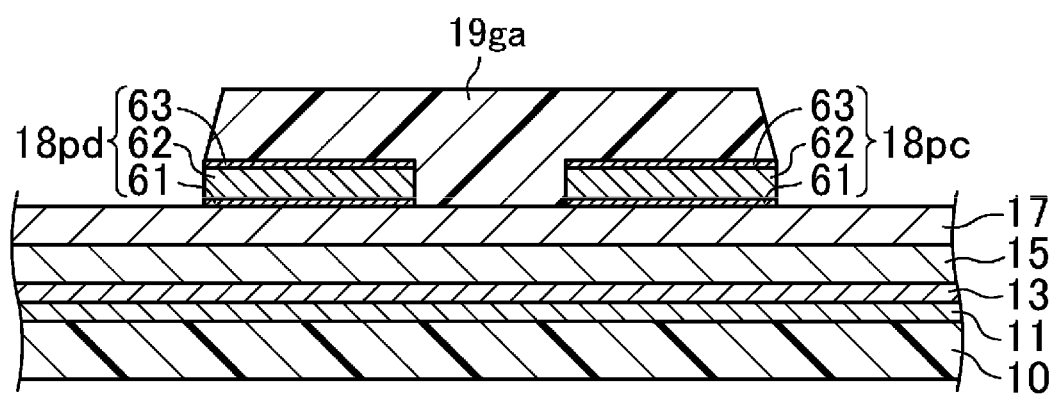
FIG. 13 is a cross-sectional view illustrating a first etching step performed when the first modified example of the separation wall configuring the organic EL display device according to the first embodiment of the disclosure is formed.
Figure 14:
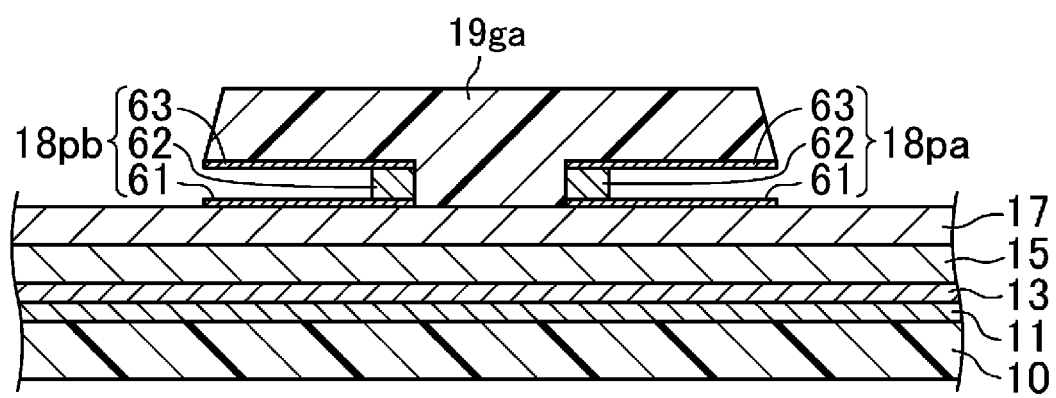
FIG. 14 is a cross-sectional view illustrating a second etching step performed when the first modified example of the separation wall configuring the organic EL display device according to the first embodiment of the disclosure is formed.

FIG. 12 is a cross-sectional view of a separation wall Eb that is a first modified example of the separation wall Ea. Also, FIGS. 13 and 14 are cross-sectional views illustrating first and second etching steps when the separation wall Eb is formed.

As illustrated in FIG. 12, the separation wall Eb includes an inner metal layer 18pa provided in a frame-like shape on the second interlayer insulating film 17 on a side of the through-hole H, an outer metal layer 18pb provided in a frame-like shape on the second interlayer insulating film 17 on a side of the display region D, and a resin layer 19ga provided in a frame-like shape on the second interlayer insulating film 17, the inner metal layer 18pa, and the outer metal layer 18pb.

The inner metal layer 18pa and the outer metal layer 18pb are formed of the same material as those of the source line 18f and the power source line 18g in the same layer. Also, as illustrated in FIG. 12, each of the inner metal layer 18pa and the outer metal layer 18pb includes a first constituent metal layer 61, a second constituent metal layer 62, and a third constituent metal layer 63 provided in this order from the resin substrate layer 10 side. Here, as illustrated in FIG. 12, the first constituent metal layer 61 and the third constituent metal layer 63 are provided protruding from the second constituent metal layer 62. In addition, as illustrated in FIG. 12, the first constituent metal layer 61 and the third constituent metal layer 63 are provided conforming to the inner protrusion portion Ja and the outer protrusion portion Jb of the resin layer 19ga. In addition, as illustrated in FIG. 12, the first constituent metal layer 61 and the second inorganic insulating film 36 are in contact with each other on the resin substrate layer 10 side of the inner protrusion portion Ja and the outer protrusion portion Jb. Also, as illustrated in FIG. 12, spaces V are provided between the second constituent metal layers 62 respectively constituting the inner metal layer 18pa and the outer metal layer 18pb and the second inorganic insulating film 36.

In forming the separation wall Eb, first, as described above, the resin layer 19ga is formed on the inner metal forming layer 18kc and the outer metal forming layer 18kd in the non-display region N (see FIG. 10).

Subsequently, after a resist pattern (not illustrated) is formed such that the resin layer 19ga is exposed, as illustrated in FIG. 13, the inner metal forming layer 18kc and the outer metal forming layer 18kd are partially removed through dry etching to form an inner metal forming layer 18pc and an outer metal forming layer 18pd.

Furthermore, as illustrated in FIG. 10, in the organic EL element layer forming step described above, when the first electrode 21a is formed, as illustrated in FIG. 14, the inner metal layer 18pa and the outer metal layer 18pb may be formed by partially removing the second constituent metal layer 62 constituting the inner metal forming layer 18pc and the outer metal forming layer 18pd, from the lateral side through wet etching.

According to the organic EL display device including the separation wall Eb having the configuration described above, the inner metal layer 18pa and the outer metal layer 18pb can be formed simultaneously with wet etching performed when the first electrode 21a is formed, and thus the separation wall Eb that improves reliability can be formed without adding a new photolithography step or an etching step.

Second Modified Example

Figure 15:
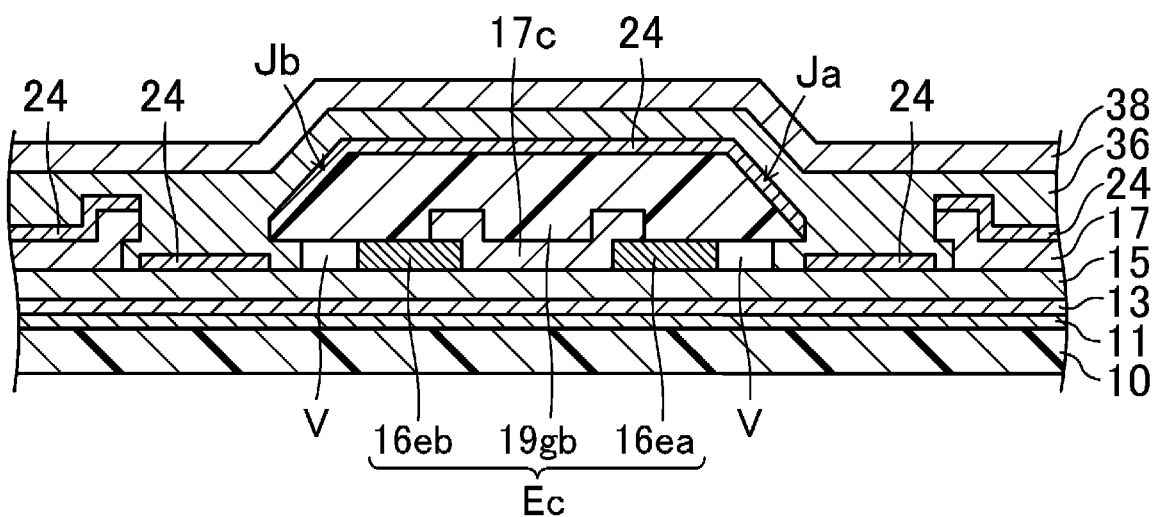
FIG. 15 is a cross-sectional view of a second modified example of a separation wall configuring the organic EL display device according to the first embodiment of the disclosure.

FIG. 15 is a cross-sectional view of a separation wall Fe that is a second modified example of the separation wall Ea. FIGS. 16, 17, 18, and 19 are cross-sectional views illustrating a step of forming a second interlayer insulating film, a step of patterning the second interlayer insulating film, a step of forming a flattening film, and a step of etching when the separation wall Ec is formed.

As illustrated in FIG. 15, the separation wall Ec includes an inner metal layer 16ea provided in a frame-like shape on the first interlayer insulating film 15 on a side of the through-hole H, an outer metal layer 16eb provided in a frame-like shape on the first interlayer insulating film 15 on a side of the display region D, and a resin layer 19gb provided in a frame-like shape on the first interlayer insulating film 15, the inner metal layer 16ea, and the outer metal layer 16eb with a middle insulating layer 17c interposed therebetween.

The inner metal layer 16ea and the outer metal layer 16eb are formed of the same material as that of the upper conductive layer 16c in the same layer. Here, as illustrated in FIG. 15, spaces V are respectively provided between the inner metal layer 16ea and the outer metal layer 16eb and the second inorganic insulating film 36. As illustrated in FIG. 15, the spaces V are provided on the display region D side and the through-hole H side of the separation wall Ec, respectively, so as to be surrounded by the second inorganic insulating film 36, the resin layer 19gb, and the first interlayer insulating film 15.

The resin layer 19gb is formed of the same material as that of the flattening film 19a in the same layer. Additionally, as illustrated in FIG. 15, the resin layer 19gb includes an inner protrusion portion Ja provided in an eaves shape and protruding from the inner metal layer 16ea toward the through-hole H and an outer protrusion portion Jb provided in an eaves shape and protruding from the outer metal layer 16eb toward the display region D.

In forming the separation wall Ec, when the source electrode 18a, the drain electrode 18b of the first TFT 9a and the like are formed, first, the inner metal forming layer 18ec (see FIG. 16) and the outer metal forming layer 18ed (see FIG. 16) are formed in the non-display region N.

Figure 16:
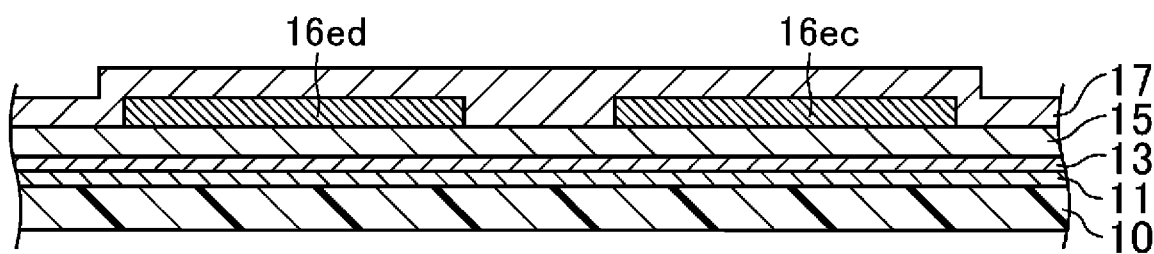
FIG. 16 is a cross-sectional view illustrating a step of forming a second interlayer insulating film performed when the second modified example of the separation wall configuring the organic EL display device according to the first embodiment of the disclosure is formed.

Subsequently, as illustrated in FIG. 16, the second interlayer insulating film 17 is formed to cover the inner metal forming layer 18ec and the outer metal forming layer 18ed in the non-display region N.

Figure 17:
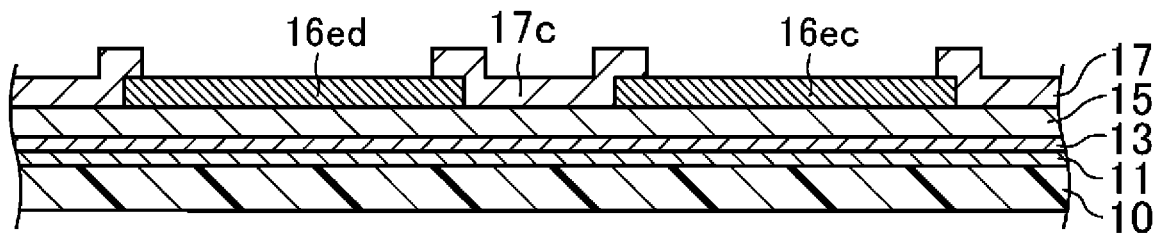
FIG. 17 is a cross-sectional view illustrating a step of patterning the second interlayer insulating film performed when the second modified example of the separation wall configuring the organic EL display device according to the first embodiment of the disclosure is formed.

Thereafter, as illustrated in FIG. 17, the second interlayer insulating film 17 is patterned to form the middle insulating layer 17c.

Figure 18:
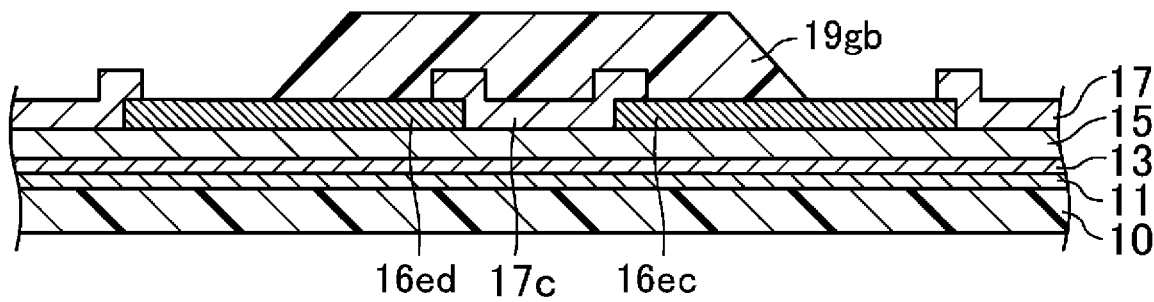
FIG. 18 is a cross-sectional view illustrating a step of forming a flattening film performed when the second modified example of the separation wall configuring the organic EL display device according to the first embodiment of the disclosure is formed.

Furthermore, when the flattening film 19a is formed, as illustrated in FIG. 18, a resin layer 19gb is formed on the middle insulating layer 17c in the non-display region N.

Figure 19:
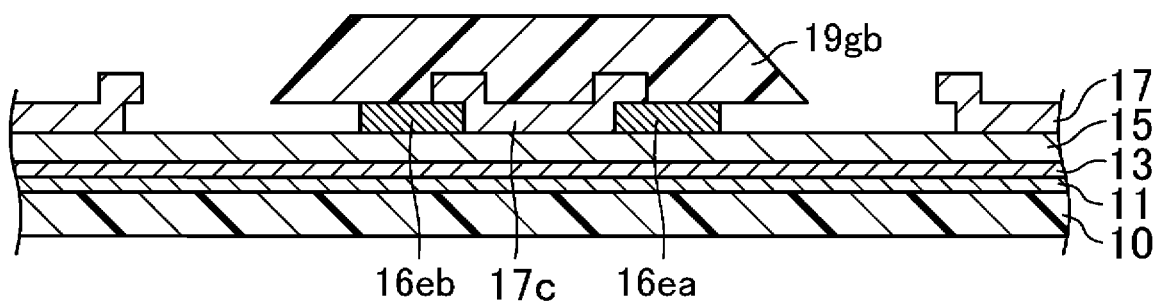
FIG. 19 is a cross-sectional view illustrating an etching step performed when the second modified example of the separation wall configuring the organic EL display device according to the first embodiment of the disclosure is formed.

Finally, as illustrated in FIG. 19, in the organic EL element layer forming step, when the first electrode 21a is formed, as illustrated in FIG. 19, the inner metal layer 16ea and the outer metal layer 16eb may be formed by partially removing the inner metal forming layer 18ec and the outer metal forming layer 18ed from the lateral side through wet etching.

According to the organic EL display device including the separation wall Ec having the configuration described above, the inner metal layer 16ea and the outer metal layer 16eb can be formed simultaneously with wet etching performed when the first electrode 21a is formed, and thus the separation wall Ec that improves reliability can be formed without adding a new photolithography step or an etching step.

Third Modified Example

Figure 20:
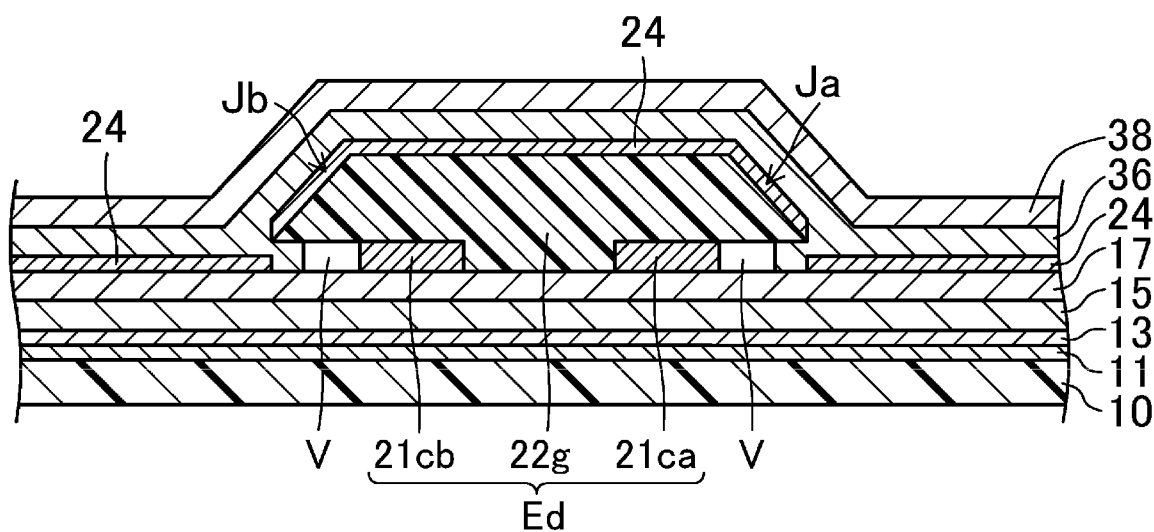
FIG. 20 is a cross-sectional view of a third modified example of the separation wall configuring the organic EL display device according to the first embodiment of the disclosure.
Figure 21:
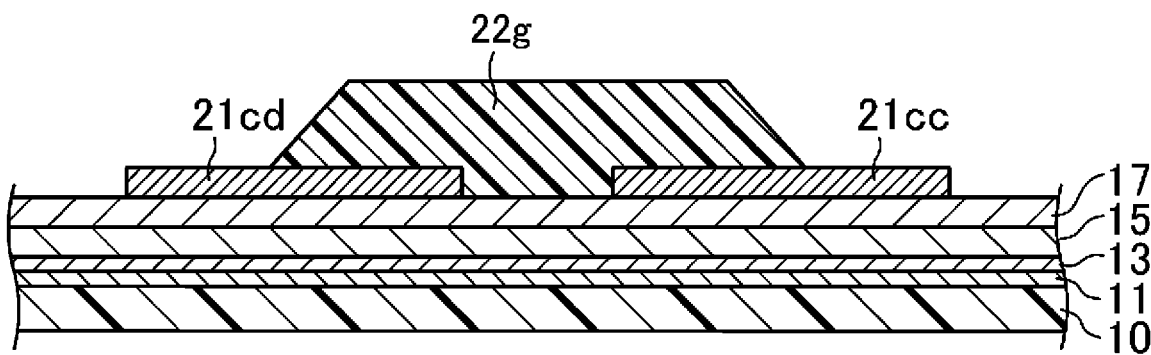
FIG. 21 is a cross-sectional view illustrating a step of forming an edge cover performed when the third modified example of the separation wall configuring the organic EL display device according to the first embodiment of the disclosure is formed.
Figure 22:
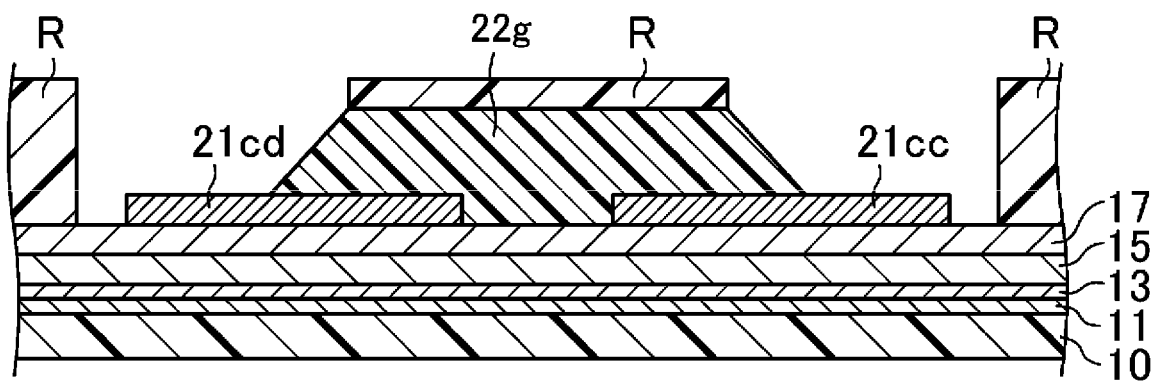
FIG. 22 is a cross-sectional view illustrating a step of forming a resist pattern performed when the third modified example of the separation wall configuring the organic EL display device according to the first embodiment of the disclosure is formed.
Figure 23:
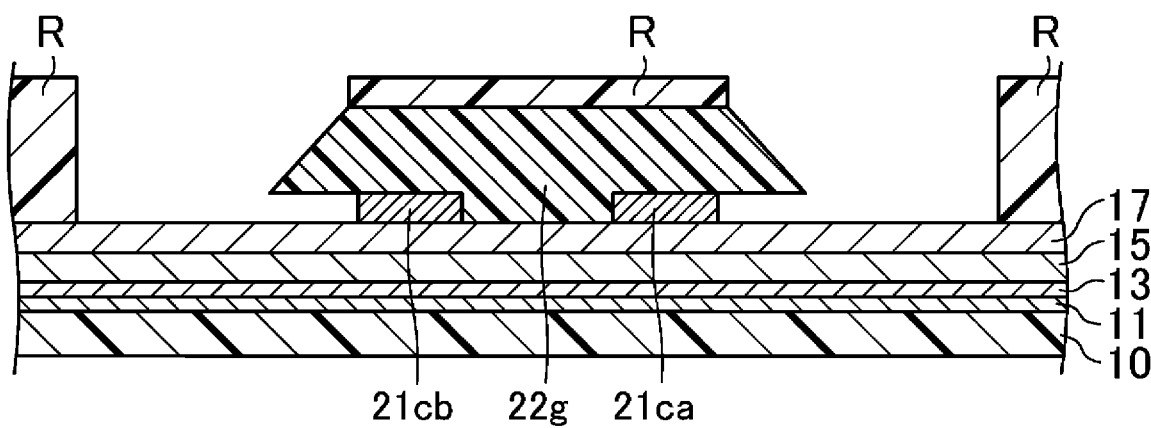
FIG. 23 is a cross-sectional view illustrating an etching step performed when the third modified example of the separation wall configuring the organic EL display device according to the first embodiment of the disclosure is formed.

FIG. 20 is a cross-sectional view of a separation wall Ed that is a third modified example of the separation wall Ea. FIGS. 21, 22, and 23 are cross-sectional views illustrating a step of forming an edge cover, a step of forming a resist pattern, and a step of etching performed when the separation wall Ed is formed.

As illustrated in FIG. 20, the separation wall Ed includes an inner metal layer 21ca provided in a frame-like shape on the second interlayer insulating film 17 on a side of the through-hole H, an outer metal layer 21cb provided in a frame-like shape on the second interlayer insulating film 17 on a side of the display region D, and a resin layer 22g provided in a frame-like shape on the second interlayer insulating film 17, the inner metal layer 21ca, and the outer metal layer 21cb.

The inner metal layer 21ca and the outer metal layer 21cb are formed of the same material as that of the first electrode 21a in the same layer. Here, as illustrated in FIG. 20, spaces V are respectively provided between the inner metal layer 21ca and the outer metal layer 21cb and the second inorganic insulating film 36. As illustrated in FIG. 20, the spaces V are provided on the display region D side and the through-hole H side of the separation wall Ed so as to be surrounded by the second inorganic insulating film 36, the resin layer 22g, and the second interlayer insulating film 17.

The resin layer 22g is formed of the same material as that of the edge cover 22a in the same layer. Additionally, as illustrated in FIG. 20, the resin layer 22g includes an inner protrusion portion Ja provided in an eaves shape and protruding from the inner metal layer 21ca toward the through-hole H and an outer protrusion portion Jb provided in an eaves shape and protruding from the outer metal layer 21cb toward the display region D.

In forming the separation wall Ed, first, in the organic EL element layer forming step described above, when the first electrode 21a is formed, an inner metal forming layer 21cc (see FIG. 21) and an outer metal forming layer 21cd (see FIG. 21) are formed in the non-display region N.

Next, when the edge cover 22a and the like are formed, as illustrated in FIG. 21, a resin layer 22g is formed in the non-display region N.

Furthermore, as illustrated in FIG. 22, after the resist pattern R is formed such that the side surface of the resin layer 22g is exposed, as illustrated in FIG. 23, an inner metal layer 21ca and an outer metal layer 21cb may be formed by partially removing the inner metal forming layer 21cc and the outer metal forming layer 21cd exposed from the resist pattern R from the lateral side through wet etching.

According to the organic EL display device including the separation wall Ed having the configuration described above, after the edge cover 22a is formed in the organic EL element layer forming step, the separation wall Ed that improves reliability can be formed using a protective resist that protects the substrate surface until the next step of a vapor deposition step as the resist pattern R.

Fourth Modified Example

Figure 24:
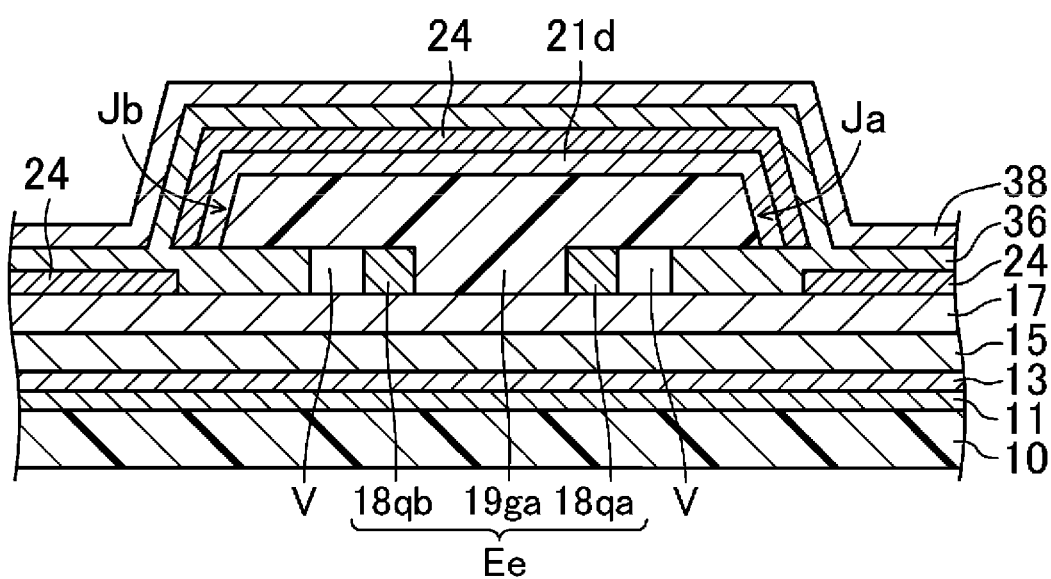
FIG. 24 is a cross-sectional view of a fourth modified example of the separation wall configuring the organic EL display device according to the first embodiment of the disclosure.

FIG. 24 is a cross-sectional view of a separation wall Re that is a fourth modified example of the separation wall Ea.

As illustrated in FIG. 24, the separation wall Ee includes an inner metal layer 18qa provided in a frame-like shape on the second interlayer insulating film 17 on a side of the through-hole H, an outer metal layer 18qb provided in a frame-like shape on the second interlayer insulating film 17 on a side of the display region D, a resin layer 19ga provided in a frame-like shape on the second interlayer insulating film 17, the inner metal layer 18qa, and the outer metal layer 18qb, and a reinforcing layer 21d provided on the resin layer 19ga.

The inner metal layer 18qa and the outer metal layer 18qb are formed of the same material as those of the source line 18f and the power source line 18g in the same layer, Here, as illustrated in FIG. 24, spaces V are respectively provided between the inner metal layer 18qa and the outer metal layer 18qb and the second inorganic insulating film 36. As illustrated in FIG. 24, the spaces V are provided on the display region D side and the through-hole H side of the separation wall Ee so as to be surrounded by the second inorganic insulating film 36, the resin layer 19ga, and the second interlayer insulating film 17.

The reinforcing layer 21d is formed of the same material as that of the first electrode 21a in the same layer and can be formed when the first electrode 21a is formed in the organic EL element layer forming step described above.

According to the organic EL display device including the separation wall Ee having the configuration described above, since the reinforcing layer 21d is provided on the resin layer 19ga, damage and peeling-off of the separation wall Ee can be inhibited.

Fifth Modified Example

Figure 25:
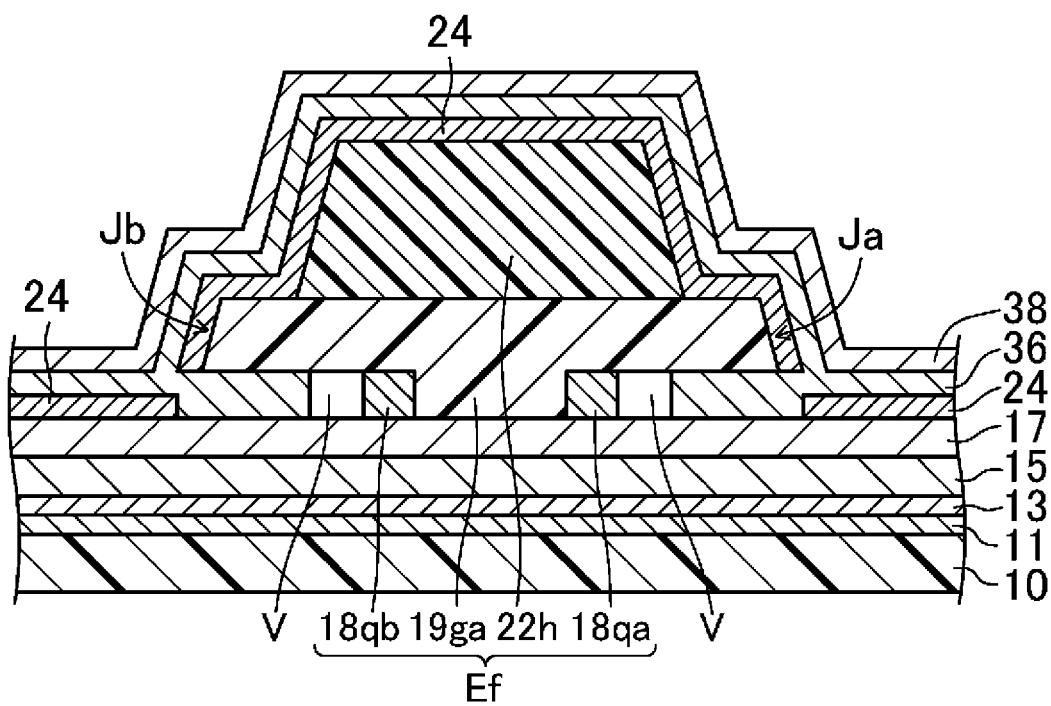
FIG. 25 is a cross-sectional view of a fifth modified example of the separation wall configuring the organic EL display device according to the first embodiment of the disclosure.

FIG. 25 is a cross-sectional view of a separation wall Ef that is a fifth modified example of the separation wall Ea.

As illustrated in FIG. 25, the separation wall Ef includes an inner metal layer 18qa provided in a frame-like shape on the second interlayer insulating film 17 on a side of the through-hole H, an outer metal layer 18qb provided in a frame-like shape on the second interlayer insulating film 17 on a side of the display region D, a lower-layer resin layer 19ga provided in a frame-like shape on the second interlayer insulating film 17, the inner metal layer 18qa, and the outer metal layer 18qb, and an upper-layer resin layer 22h provided on the lower-layer resin layer 19ga.

The upper-layer resin layer 22h is formed of the same material as the that of the edge cover 22a in the same layer and can be formed when the edge cover 22a is formed in the organic EL element layer forming step described above.

According to the organic EL display device including the separation wall Ef having the configuration described above, paths of the second inorganic insulating film 36 and the third inorganic insulating film 38 to the display region D are long, and thus propagation of cracks in the second inorganic insulating film 36 and the third inorganic insulating film 38 can be inhibited, whereby the separation wall Ef that improves reliability can be formed.

Sixth Modified Example

Figure 26:
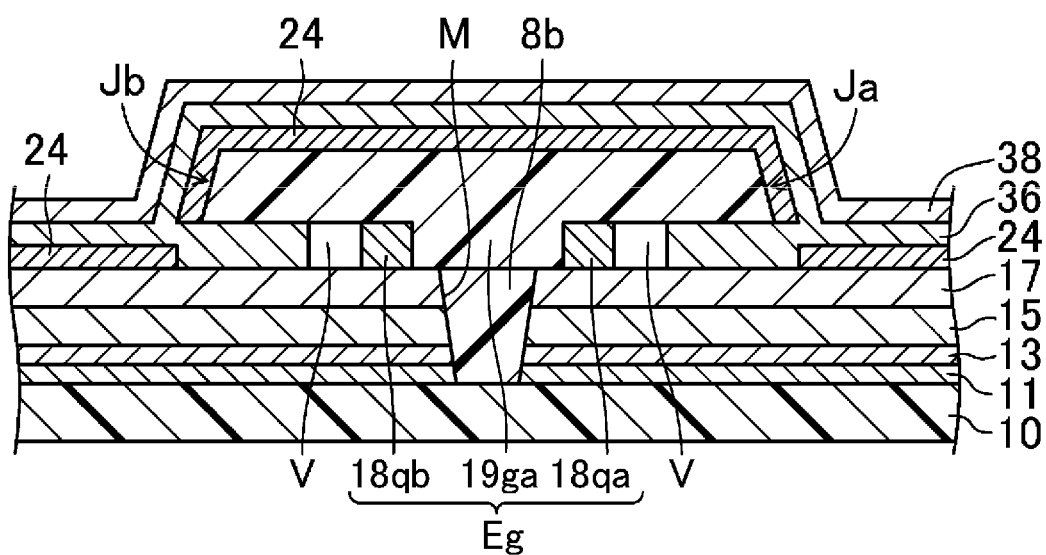
FIG. 26 is a cross-sectional view of a sixth modified example of the separation wall configuring the organic EL display device according to the first embodiment of the disclosure.

FIG. 26 is a cross-sectional view of a separation wall Eg that is a sixth modified example of the separation wall Ea.

The separation wall Eg has substantially the same configuration as the separation wall Ee of the fourth modified example, and a resin filling layer 8b is provided on the resin substrate layer 10 side of the separation wall Eg.

As illustrated in FIG. 26, the resin filling layer 8b is provided to fill in an opening portion M formed in the base coat film 11, the gate insulating film 13, the first interlayer insulating film 15, and the second interlayer insulating film 17. Here, as illustrated in FIG. 26, the opening portion M is provided in the base coat film 11, the gate insulating film 13, the first interlayer insulating film 15, and the second interlayer insulating film 17 in a frame-like shape to overlap with the separation wall Eg and extend through the base coat film 11, the gate insulating film 13, the first interlayer insulating film 15, and the second interlayer insulating film 17 and can be formed when the slit S of the bending portion B is formed. In addition, the resin filling layer 8b is formed of the same material as that of the lower layer flattening film 8a, which is provided in the bending portion B, in the same layer and can be formed when the lower layer flattening film 8a is formed.

According to the organic EL display device including the separation wall Eg having the configuration described above, the resin filling layer 8b is provided to fill in the opening portion M formed in the base coat film 11, the gate insulating film 13, the first interlayer insulating film 15, and the second interlayer insulating film 17, and thus, for example, propagation of cracks generated in the base coat film 11, the gate insulating film 13, the first interlayer insulating film 15, and the second interlayer insulating film 17 on the through-hole H side to the display region D side can be inhibited. In addition, the resin filling layer 8b is provided overlapping with the separation wall Eg, and thus a distance from the through-hole H to a boundary between the non-display region N and the display region D can be shortened even when the structure for inhibiting propagation of cracks is employed.

Seventh Modified Example

Figure 27:
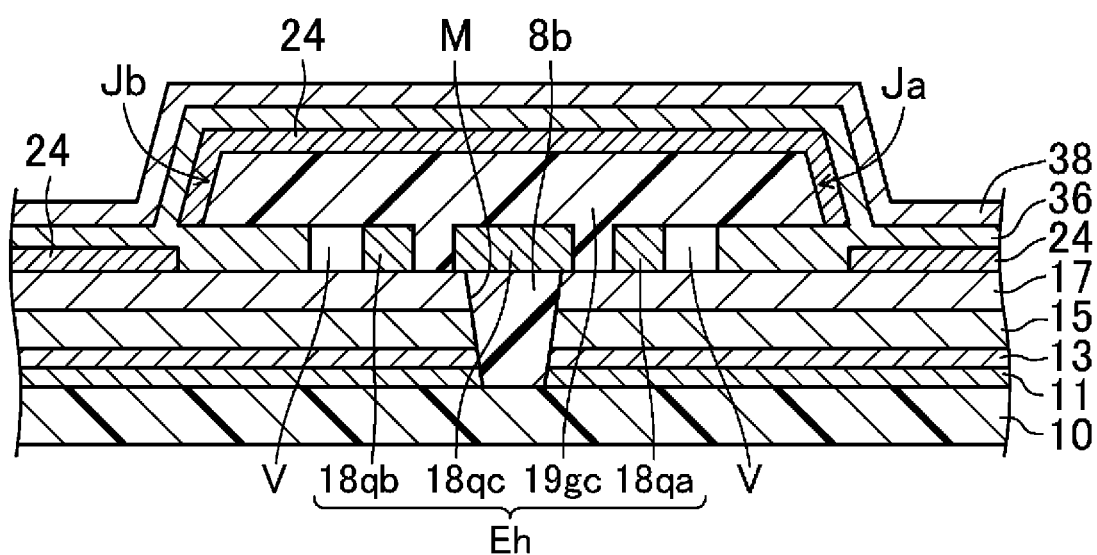
FIG. 27 is a cross-sectional view of a seventh modified example of the separation wall configuring the organic EL display device according to the first embodiment of the disclosure.

FIG. 27 is a cross-sectional view of a separation wall Eh that is a seventh modified example of the separation wall Ea.

As illustrated in FIG. 27, the separation wall Eh includes an inner metal layer 18qa provided in a frame-like shape on the second interlayer insulating film 17 on a side of the through-hole H, an outer metal layer 18qb provided in a frame-like shape on the second interlayer insulating film 17 on a side of the display region D, a middle metal layer 18qc provided in a frame-like shape between the inner metal layer 18qa and the outer metal layer 18qb on the second interlayer insulating film 17, and a resin layer 19gc provided in a frame-like shape on the second interlayer insulating film 17, the inner metal layer 18qa, the middle metal layer 18qc, and the outer metal layer 18qb.

The middle metal layer 18qc is formed of the same material as those of the inner metal layer 18qa and the outer metal layer 18qb in the same layer and can be formed when the inner metal layer 18qa and the outer metal layer 18qb are formed.

The resin layer 19gc is formed of the same material as that of the flattening film 19a in the same layer. In addition, as illustrated in FIG. 27, the resin layer 19gc includes an inner protrusion portion Ja provided in an eaves shape and protruding from the inner metal layer 18qa toward the through-hole and an outer protrusion portion Jb provided in an eaves shape and protruding from the outer metal layer 18qb toward the display region D.

According to the organic EL display device including the separation wall Eh having the configuration described above, the resin filling layer 8b is provided to fill in the opening portion M formed in the base coat film 11, the gate insulating film 13, the first interlayer insulating film 15, and the second interlayer insulating film 17, and thus, for example, propagation of cracks generated in the base coat film 11, the gate insulating film 13, the first interlayer insulating film 15, and the second interlayer insulating film 17 on the through-hole H side to the display region D side can be inhibited. In addition, the resin filling layer 8b is provided overlapping with the separation wall Eh, and thus a distance from the through-hole H to a boundary between the non-display region N and the display region D can be shortened even when a structure for inhibiting propagation of cracks is employed. In addition, the middle metal layer 18qc having ductility is provided between the resin filling layer 8b and the resin layer 19gc, and thus, for example, propagation of cracks to the resin filling layer 8b can be inhibited even when cracks generated in the second inorganic insulating film 36 and the third inorganic insulating film 38 on the through-hole H side propagate to the first resin layer 19gc.

Eighth Modified Example

Figure 28:
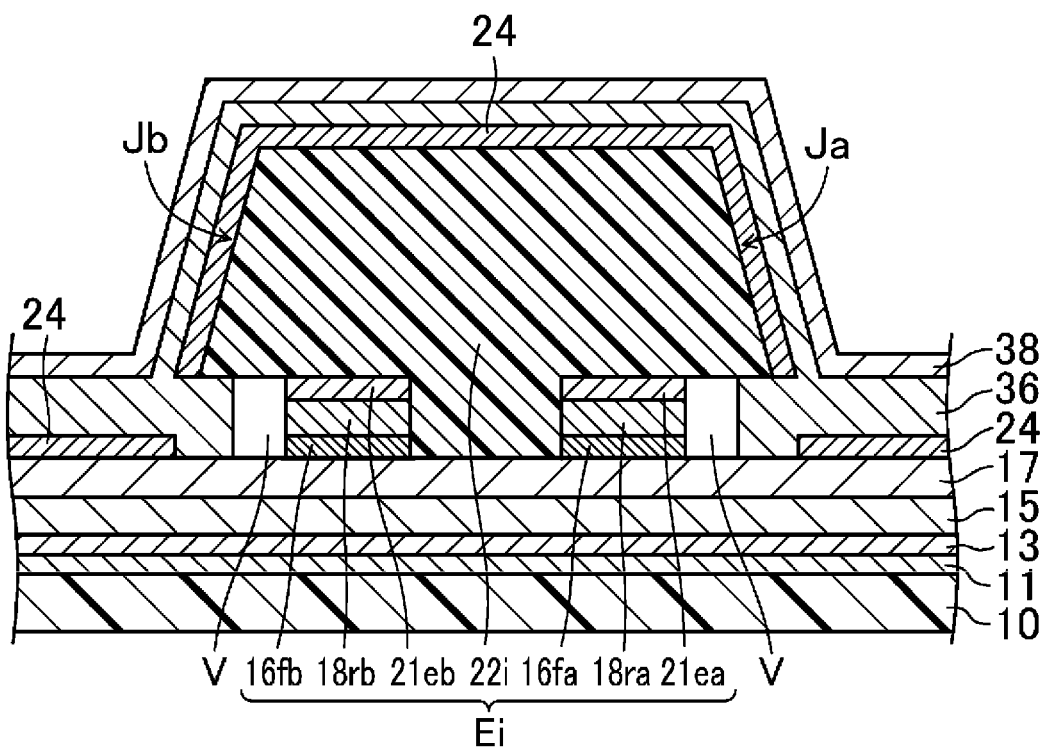
FIG. 28 is a cross-sectional view of an eighth modified example of the separation wall configuring the organic EL display device according to the first embodiment of the disclosure.

FIG. 28 is a cross-sectional view of a separation wall Ei that is an eighth modified example of the separation wall Ea.

As illustrated in FIG. 28, the separation wall Ei includes inner metal layers 16fa, 18ra, and 21ea that are provided in this order in a frame-like shape on the second interlayer insulating film 17 on a side of the through-hole H, outer metal layers 16fb, 18rb, and 21eb that are provided in this order in a frame-like shape on the second interlayer insulating film 17 on a side of the display region D, and a resin layer 22i provided in a frame-like shape on the second interlayer insulating film 17, the inner metal layer 21ea, and the outer metal layer 21eb.

The inner metal layer 16fa and the outer metal layer 16fb are formed of the same material as that of the upper conductive layer 16c in the same layer and can be formed when the upper conductive layer 16c is formed.

The inner metal layer 18ra and the outer metal layer 18rb are formed of the same material as those of the source line 18f and the power source line 18g in the same layer and can be formed when the source line 18f and the power source line 18g are formed.

The inner metal layer 21ea and the outer metal layer 21eb are formed of the same material as that of the first electrode 21a in the same layer and can be formed when the first electrode 21a is formed.

The resin layer 22i is formed of the same material as that of the edge cover 22a in the same layer and can be formed when the edge cover 22a is formed. Here, as illustrated in FIG. 28, the resin layer 22i includes an inner protrusion portion Ja provided in an eaves shape and protruding from the inner metal layers 16fa, 18ra, and 21ea toward the through-hole H and an outer protrusion portion Jb provided in an eaves shape and protruding from the outer metal layers 16fb, 18rb, and 21eb toward the display region D.

According to the organic EL display device including the separation wall Ei having the configuration described above, three layers of the inner metal layers 16fa, 18ra, and 21ea and three layers of the outer metal layers 16fb, 18rb, and 21eb are included, and thus the heights of the inner protrusion portion Ja and the outer protrusion portion Jb of the resin layer 22i from the surface of the first interlayer insulating film 15 are increased. For this reason, the hole injection layer 1, the hole transport layer 2, the electron transport layer 4, and the electron injection layer 5 that constitute the organic EL layer 23 and the second electrode 24 that are cut apart at the inner protrusion portion Ja and the outer protrusion portion Jb due to difference in level can be easily formed.

As described above, according to the organic EL display device 50 of the present embodiment, the separation wall Ea is provided in a frame-like shape along a peripheral edge of the through-hole H in the non-display region N which is defined to be in an island shape inside the display region D and in which the through-hole H is formed. Here, the separation wall Ea includes the inner metal layer 18ka and the outer metal layer 18kb that are provided in a frame-like shape on the second interlayer insulating film 17 and are formed of the same material as those of the source line 18f and the power source line 18g in the same layer and the resin layer 19ga that is provided in a frame-like shape on the second interlayer insulating film 17, the inner metal layer 18ka, and the outer metal layer 18kb. The resin layer 19ga includes the inner protrusion portion Ja provided in an eaves shape and protruding from the inner metal layer 18ka toward the through-hole H and the outer protrusion portion Jb provided in an eaves shape and protruding from the outer metal layer 18kb toward the display region D. For this reason, the common function layers (the hole injection layer 1, the hole transport layer 2, the electron transport layer and the electron injection layer 5) and second electrode 24 that are separated and cut apart into the display region D side and the through-hole H side at the inner protrusion portion Ja and the outer protrusion portion Jb are formed. In this way, the common function layers (the hole injection layer 1, the hole transport layer 2, the electron transport layer 4, and the electron injection layer 5) and the second electrode 24 that are separated into the display region D side and the through-hole H side can be formed without using a negative photosensitive material. Thus, the common function layers (the hole injection layer 1, the hole transport layer 2, the electron transport layer 4, and the electron injection layer 5) and the second electrode 24 that are separated into the display region D side and the through-hole H side can be formed at low cost.

According to the organic EL display device 50 of the present embodiment, the second interlayer insulating film 17 of the TFT layer 20 and the second inorganic insulating film 36 of the sealing film 40 are in contact with each other on the resin substrate layer 10 side of the inner protrusion portion Ja and the outer protrusion portion Jb, and thus sealing performance of the sealing film 40 can be secured, and deterioration of the organic EL element 25 can be inhibited.

In addition, according to the organic EL display device 50 of the present embodiment, the spaces V are provided between the inner metal layer 18ka and the outer metal layer 18kb and the second inorganic insulating film 36, and thus propagation of cracks generated in the second inorganic insulating film 36 on the through-hole H side to the display region D side can be inhibited.

Second Embodiment

Figure 29:
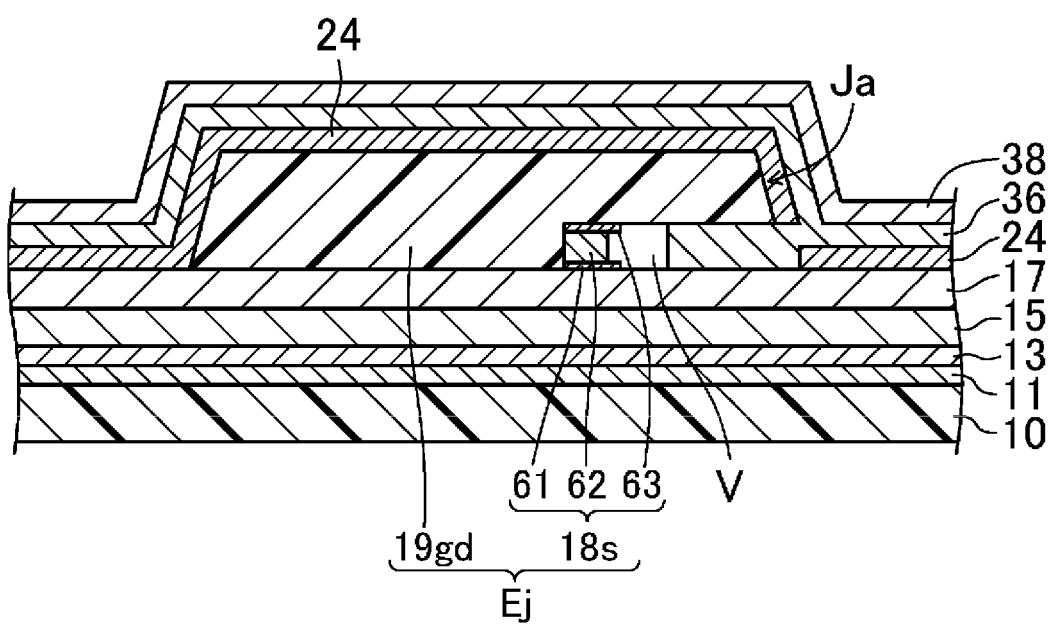
FIG. 29 is a cross-sectional view of a separation wall configuring an organic EL display device according to a second embodiment of the disclosure.

FIG. 29 illustrates a display device according to a second embodiment of the disclosure. Here, FIG. 29 is a cross-sectional view of a separation wall Ej constituting an organic EL display device according to the present embodiment. Note that, in each of the following embodiments, the same portions as those in FIG. 1 to FIG. 28 are denoted by the same reference signs, and the detailed description of these portions are omitted.

In the first embodiment described above, although the organic EL display device 50 in which the resin layer constituting the separation wall includes the inner protrusion portion Ja and the outer protrusion portion Jb has been illustrated, in the present embodiment, an organic EL display device in which a resin layer 19gd constituting a separation wall Ej includes only an inner protrusion portion Ja is illustrated.

Note that, in the organic EL display device according to the present embodiment, the configuration other than the separation wall Ej is substantially the same as that of the organic EL display device 50 according to the first embodiment, and thus, hereinafter, the configuration of the separation wall Ej will be described.

As illustrated in FIG. 29, the separation wall Ej includes an inner metal layer 18s provided in a frame-like shape on a second interlayer insulating film 17 on a side of the through-hole H and a resin layer 19*gd* provided in a frame-like shape on the second interlayer insulating film 17 and the inner metal layer 18*s*.

The inner metal layer 18*s* is formed of the same material as those of a source line 18*f* and a power source line 18*g* in the same layer. As illustrated in FIG. 29, the inner metal layer 18*s* includes a first constituent metal layer 61, a second constituent metal layer 62, and a third constituent metal layer 63 that are provided in this order from a resin substrate layer 10 side. Here, as illustrated in FIG. 29, the first constituent metal layer 61 and the third constituent metal layer 63 are provided protruding from the second constituent metal layer 62. Furthermore, as illustrated in FIG. 29, a space V is provided between the inner metal layer 18*s* and a second inorganic insulating film 36. Note that as illustrated in FIG. 29, the space V is provided so as to be surrounded by the second inorganic insulating film 36, the resin layer 19*gd*, and the second interlayer insulating film 17 on the through-hole H side of the separation wall Ej.

The resin layer 19*gd* is formed of the same material as that of a flattening film 19*a* in the same layer. In addition, as illustrated in FIG. 29, the resin layer 19*gd* includes an inner protrusion portion Ja provided in an eaves shape and protruding from an inner metal layer 18*ka* toward the through-hole H. Here, as illustrated in FIG. 29, the second electrode 24 is provided on the separation wall Ej so as to extend over from a display region D to the through-hole H and is cut apart at the inner protrusion portion Ja. Note that, in FIG. 29, although a hole injection layer 1, a hole transport layer 2, an electron transport layer 4, and an electron injection layer 5 are not illustrated, similar to the second electrode 24, common function layers including the hole injection layer 1, the hole transport layer 2, the electron transport layer 4, and the electron injection layer 5 are provided on the separation wall Ej so as to extend over from the display region D to the through-hole H and are cut apart at the inner protrusion portion Ja. Furthermore, as illustrated in FIG. 29, the second inorganic insulating film 36 and the third inorganic insulating film 38 constituting the sealing film 40 are provided on the separation wall Ej so as to extend over from the display region D to the through-hole H, and the second inorganic insulating film 36 is provided on a side of the resin substrate layer 10 of the inner protrusion portion Ja. In addition, as illustrated in FIG. 2, the second interlayer insulating film 17 and the second inorganic insulating film 36 are in contact with each other on a side of the resin substrate layer 10 of the inner protrusion portion Ja.

Note that, in the present embodiment, although the organic EL display device including the separation wall Ej having the structure of the separation wall Ea on the through-hole H side according to the first embodiment described above has been illustrated, each of the separation walls having the structures of the separation walls Eb to Ei on the through-hole H side of the modified examples of the first embodiment described above may be used in place of the separation wall Ej.

As described above, according to the organic EL display device of the present embodiment, the separation wall Ej is provided in a frame-like shape along a peripheral edge of the through-hole H in the non-display region N which is defined in an island shape inside the display region 1 and in which the through-hole H is formed. Here, the separation wall Ej includes the inner metal layer 18*s* provided in a frame-like shape on the second interlayer insulating film 17 and formed of the same material as those of the source line 18*f* and the power source line 18*g* in the same layer and the resin layer 19*gd* provided in a frame-like shape on the second interlayer insulating film 17 and the metal layer 18*s*. The resin layer 19*gd* includes the inner protrusion portion Ja provided in an eaves shape and protruding from the inner metal layer 18*s* toward the through-hole H. For this reason, the common function layers (the hole injection layer 1, the hole transport layer 2, the electron transport layer 4, and the electron injection layer 5) and the second electrode 24 that are separated and cut apart into the display region 1 side and the through-hole side at the inner protrusion portion Ja are formed. In this way, the common function layers (the hole injection layer 1, the hole transport layer 2, the electron transport layer 4, and the electron injection layer 5) and the second electrode 24 that are separated into the display region D side and the through-hole H side can be formed without using a negative photosensitive material. Thus, the common function layers (the hole injection layer 1, the hole transport layer 2, the electron transport layer 4, and the electron injection layer 5) and the second electrode 24 that are separated into the display region D side and the through-hole H side can be formed at low cost.

In addition, according to the organic EL display device of the present embodiment, the second interlayer insulating film 17 of the TFT layer 20 and the second inorganic insulating film 36 of the sealing film 40 are in contact with each other on the resin substrate layer 10 side of the inner protrusion portion Ja, and thus sealing performance according to the sealing film 40 can be secured, whereby deterioration of the organic EL element 25 can be inhibited.

In addition, according to the organic EL display device of the present embodiment, the space V is provided between the inner metal layer 18*s* and the second inorganic insulating film 36, and thus propagation of cracks generated in the second inorganic insulating film 36 on the through-hole H side to the display region D side can be inhibited.

Other Embodiments

In each of the embodiments described above, the organic EL layer having a five-layer structure including the hole injection layer, the hole transport layer, the light-emitting layer, the electron transport layer, and the electron injection layer is exemplified, but the organic EL layer may have a three-layer structure including a hole injection-cum-transport layer, a light-emitting layer, and an electron transport-cum-injection layer, for example.

In each of the embodiments described above, the organic EL display device including the first electrode as an anode and the second electrode as a cathode is exemplified. The disclosure is also applicable to an organic EL display device in which the layered structure of the organic EL layer is reversed with the first electrode being a cathode and the second electrode being an anode.

In each of the embodiments described above, the organic EL display device in which the electrode of the TFT connected to the first electrode serves as the drain electrode is exemplified. However, the disclosure is also applicable to an organic EL display device in which the electrode of the TFT connected to the first electrode is referred to as the source electrode.

In each of the embodiments described above, the organic EL display device 50 in which the through-hole H having a circular shape in a plan view is formed is exemplified. However, for example, the through-hole H may have a polygonal shape such as a rectangular shape in a plan view.

In each of the embodiments described above, the organic EL display device 50 including the sealing film 40 in which the organic insulating film 37 is provided between the second inorganic insulating film 36 and the third inorganic insulating film 38 is exemplified. However, the disclosure is also applicable to an organic EL display device in which an organic vapor deposition film is formed between the second inorganic insulating film 36 and the third inorganic insulating film 38, and thereafter ashing is performed on the organic vapor deposition film to cover foreign matters with the organic vapor deposition film. According to such a configuration of the sealing film, even when foreign matters are present on the display region, sealing performance can be secured by the third inorganic insulating film, whereby the reliability can be improved.

In each of the embodiments described above, the organic EL display device 50 having a structure in which the inner metal layer is provided on the resin substrate layer 10 side of the resin layer including the inner protrusion portion Ja is exemplified. However, the disclosure is also applicable to an organic EL display device having a structure in which the inner metal layer on the resin substrate layer 10 side of the resin layer is completely removed through etching and does not remain.

In each of the embodiments described above, the organic EL display device is exemplified and described as the display device. However, the disclosure is not limited to the organic EL display device and also applicable to any display device as far as the display device has flexibility. For example, the disclosure is applicable to a flexible display device including QLEDs or the like that are light-emitting elements using a quantum dot containing layer.

INDUSTRIAL APPLICABILITY

As described above, the disclosure is useful for a flexible display device.

The invention claimed is:
1. A display device comprising:
  a base substrate comprising:
    a display region where an image is displayed,
    a frame region provided on a periphery of the display region, and
    a non-display region having an island shape and provided inside the display region;
  a thin film transistor layer provided on the base substrate and including a first inorganic insulating film having at least one layer;
  a light-emitting element layer in which a plurality of light-emitting elements is arranged, the light-emitting element layer being provided on the thin film transistor layer; and
  a sealing film provided on the light-emitting element layer and including a second inorganic insulating film and a third inorganic insulating film,
  wherein a first electrode, a function layer, and a second electrode are layered in this order in each of the plurality of light-emitting elements,
  a through-hole extending through in a thickness direction of the base substrate is formed in the non-display region,
  a separation wall is provided, in a frame-like shape along a peripheral edge of the through-hole, in the non-display region,
  the separation wall includes:
    an inner metal layer provided in a frame-like shape on the first inorganic insulating film on a side of the through-hole,
    a resin layer provided in a frame shape on the first inorganic insulating film and the inner metal layer, and
    an outer metal layer provided in a frame-like shape on the first inorganic insulating film on a side of the display region,
  the resin layer includes an inner protrusion portion provided in an eaves shape and protruding from the inner metal layer,
  a plurality of subpixels is arranged in correspondence with the plurality of light-emitting elements in the display region,
  the function layer includes a common function layer provided in common with the plurality of subpixels,
  the common function layer is provided on the separation wall while extending over from the display region to the through-hole and is cut apart at the inner protrusion portion,
  the second inorganic insulating film and the third inorganic insulating film are provided to cover the separation wall while extending over from the display region to the through-hole,
  the second inorganic insulating film is provided on a side of the base substrate of the inner protrusion portion,
  the resin layer is further provided on the first inorganic insulating film, the inner metal layer, and the outer metal layer, and further includes an outer protrusion portion provided in an eaves shape and protruding from the outer metal layer,
  the common function layer is further cut apart at the outer protrusion portion,
  the second inorganic insulating film is provided on a side of the base substrate of the outer protrusion portion, and
  a reinforcing layer formed of the same material and in the same layer as the first electrode is provided on the resin layer.
2. The display device according to claim 1,
  wherein the thin film transistor layer further includes a flattening film provided on a side of the light-emitting element layer, and
  the resin layer is formed of the same material and in the same layer as the flattening film.
3. The display device according to claim 1,
  wherein the light-emitting element layer includes an edge cover provided to cover a peripheral end portion of the first electrode of each of the plurality of light-emitting elements, and
  the resin layer is formed of the same material and in the same layer as the edge cover.
4. The display device according to claim 1,
  wherein the thin film transistor layer further includes a flattening film provided on a side of the light-emitting element layer,
  the light-emitting element layer includes an edge cover provided to cover a peripheral end portion of the first electrode of each of the plurality of light-emitting elements, and
  the resin layer is provided by layering a lower-layer resin layer formed of the same material and in the same layer as the flattening film and an upper-layer resin layer formed of the same material and in the same layer as the edge cover.
5. The display device according to claim 1,
  wherein an opening portion overlapping with the separation wall and extending through the first inorganic insulating film is provided in a frame-like shape in the first inorganic insulating film, a resin filling layer is provided in the opening portion and fills in the opening portion, and
the separation wall is provided on the resin filling layer.
6. The display device according to claim 5, wherein a middle metal layer is provided between the separation wall and the resin filling layer.
7. The display device according to claim 1, wherein the first inorganic insulating film includes a lower first inorganic insulating film and an upper first inorganic insulating film provided in this order from a side of the base substrate,
a first wiring line layer is provided between the lower first inorganic insulating film and the upper first inorganic insulating film, and
a second wiring line layer is provided on the upper first inorganic insulating film.
8. The display device according to claim 7, wherein the inner metal layer and the outer metal layer include a first metal layer formed of the same material and in the same layer as the first wiring line layer.
9. A display device comprising:
a base substrate comprising:
    a display region where an image is displayed,
    a frame region provided on a periphery of the display region, and
    a non-display region having an island shape and provided inside the display region;
a thin film transistor layer provided on the base substrate and including a first inorganic insulating film having at least one layer;
a light-emitting element layer in which a plurality of light-emitting elements is arranged, the light-emitting element layer being provided on the thin film transistor layer; and
a sealing film provided on the light-emitting element layer and including a second inorganic insulating film and a third inorganic insulating film,
wherein a first electrode, a function layer, and a second electrode are layered in this order in each of the plurality of light-emitting elements,
a through-hole extending through in a thickness direction of the base substrate is formed in the non-display region,
a separation wall is provided, in a frame-like shape along a peripheral edge of the through-hole, in the non-display region,
the separation wall includes:
    an inner metal layer provided in a frame-like shape on the first inorganic insulating film on a side of the through-hole,
    a resin layer provided in a frame shape on the first inorganic insulating film and the inner metal layer, and
    an outer metal layer provided in a frame-like shape on the first inorganic insulating film on a side of the display region,
the resin layer includes an inner protrusion portion provided in an eaves shape and protruding from the inner metal layer,
a plurality of subpixels is arranged in correspondence with the plurality of light-emitting elements in the display region,
the function layer includes a common function layer provided in common with the plurality of subpixels, the common function layer is provided on the separation wall while extending over from the display region to the through-hole and is cut apart at the inner protrusion portion,
the second inorganic insulating film and the third inorganic insulating film are provided to cover the separation wall while extending over from the display region to the through-hole,
the second inorganic insulating film is provided on a side of the base substrate of the inner protrusion portion,
the resin layer is further provided on the first inorganic insulating film, the inner metal layer, and the outer metal layer, and further includes an outer protrusion portion provided in an eaves shape and protruding from the outer metal layer,
the common function layer is further cut apart at the outer protrusion portion,
the second inorganic insulating film is provided on a side of the base substrate of the outer protrusion portion,
the first inorganic insulating film includes a lower first inorganic insulating film and an upper first inorganic insulating film provided in this order from a side of the base substrate,
a first wiring line layer is provided between the lower first inorganic insulating film and the upper first inorganic insulating film,
a second wiring line layer is provided on the upper first inorganic insulating film, and
the inner metal layer and the outer metal layer include a first metal layer formed of the same material and in the same layer as the first wiring line layer.
10. The display device according to claim 9, wherein the thin film transistor layer further includes a flattening film provided on a side of the light-emitting element layer, and
the resin layer is formed of the same material and in the same layer as the flattening film.
11. The display device according to claim 9, wherein the light-emitting element layer includes an edge cover provided to cover a peripheral end portion of the first electrode of each of the plurality of light-emitting elements, and
the resin layer is formed of the same material and in the same layer as the edge cover.
12. A display device comprising:
a base substrate comprising:
    a display region where an image is displayed,
    a frame region provided on a periphery of the display region, and
    a non-display region having an island shape and provided inside the display region;
a thin film transistor layer provided on the base substrate and including a first inorganic insulating film having at least one layer;
a light-emitting element layer in which a plurality of light-emitting elements is arranged, the light-emitting element layer being provided on the thin film transistor layer; and
a sealing film provided on the light-emitting element layer and including a second inorganic insulating film and a third inorganic insulating film,
wherein a first electrode, a function layer, and a second electrode are layered in this order in each of the plurality of light-emitting elements,
a through-hole extending through in a thickness direction of the base substrate is formed in the non-display region, a separation wall is provided, in a frame-like shape along a peripheral edge of the through-hole, in the non-display region, the separation wall includes:
- an inner metal layer provided in a frame-like shape on the first inorganic insulating film on a side of the through-hole,
- a resin layer provided in a frame shape on the first inorganic insulating film and the inner metal layer, and
- an outer metal layer provided in a frame-like shape on the first inorganic insulating film on a side of the display region, the resin layer includes an inner protrusion portion provided in an eaves shape and protruding from the inner metal layer, a plurality of subpixels is arranged in correspondence with the plurality of light-emitting elements in the display region, the function layer includes a common function layer provided in common with the plurality of subpixels, the common function layer is provided on the separation wall while extending over from the display region to the through-hole and is cut apart at the inner protrusion portion, the second inorganic insulating film and the third inorganic insulating film are provided to cover the separation wall while extending over from the display region to the through-hole, the second inorganic insulating film is provided on a side of the base substrate of the inner protrusion portion, the resin layer is further provided on the first inorganic insulating film, the inner metal layer, and the outer metal layer, and further includes an outer protrusion portion provided in an eaves shape and protruding from the outer metal layer, the common function layer is further cut apart at the outer protrusion portion, the second inorganic insulating film is provided on a side of the base substrate of the outer protrusion portion, and spaces are provided between the inner metal layer and the second inorganic insulating film and between the outer metal layer and the second inorganic insulating film, respectively.

13. The display device according to claim 12, wherein the thin film transistor layer further includes a flattening film provided on a side of the light-emitting element layer, and
the resin layer is formed of the same material and in the same layer as the flattening film.

14. The display device according to claim 12, wherein the light-emitting element layer includes an edge cover provided to cover a peripheral end portion of the first electrode of each of the plurality of light-emitting elements, and
the resin layer is formed of the same material and in the same layer as the edge cover.

15. The display device according to claim 12, wherein the thin film transistor layer further includes a flattening film provided on a side of the light-emitting element layer,
the light-emitting element layer includes an edge cover provided to cover a peripheral end portion of the first electrode of each of the plurality of light-emitting elements, and
the resin layer is provided by layering a lower-layer resin layer formed of the same material and in the same layer as the flattening film and an upper-layer resin layer formed of the same material and in the same layer as the edge cover.

16. The display device according to claim 12, wherein a reinforcing layer formed of the same material and in the same layer as the first electrode is provided on the resin layer.

17. The display device according to claim 12, wherein an opening portion overlapping with the separation wall and extending through the first inorganic insulating film is provided in a frame-like shape in the first inorganic insulating film,
a resin filling layer is provided in the opening portion and fills in the opening portion, and
the separation wall is provided on the resin filling layer.

18. The display device according to claim 17, wherein a middle metal layer is provided between the separation wall and the resin filling layer.

19. The display device according to claim 12, wherein the first inorganic insulating film includes a lower first inorganic insulating film and an upper first inorganic insulating film provided in this order from a side of the base substrate,
a first wiring line layer is provided between the lower first inorganic insulating film and the upper first inorganic insulating film, and
a second wiring line layer is provided on the upper first inorganic insulating film.

20. The display device according to claim 19, wherein the inner metal layer and the outer metal layer include a first metal layer formed of the same material and in the same layer as the first wiring line layer.

* * * * *